United States Patent
Watanabe

(10) Patent No.: US 9,583,945 B2
(45) Date of Patent: Feb. 28, 2017

(54) FREQUENCY CONTROL METHOD AND FREQUENCY CONTROL APPARATUS

(71) Applicant: Panasonic Intellectual Property Management Co., Ltd., Osaka (JP)

(72) Inventor: Kenichi Watanabe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 149 days.

(21) Appl. No.: 14/722,431

(22) Filed: May 27, 2015

(65) Prior Publication Data

US 2015/0357854 A1 Dec. 10, 2015

(30) Foreign Application Priority Data

Jun. 9, 2014 (JP) ................... 2014-118976

(51) Int. Cl.
*H02J 7/00* (2006.01)
*H02J 3/32* (2006.01)
*H02J 3/24* (2006.01)

(52) U.S. Cl.
CPC ... *H02J 3/32* (2013.01); *H02J 3/24* (2013.01)

(58) Field of Classification Search
CPC .......................................... H02J 3/32
USPC ....................................... 320/134
See application file for complete search history.

(56) References Cited

U.S. PATENT DOCUMENTS

| | | | | |
|---|---|---|---|---|
| 5,891,590 A | * | 4/1999 | King | H01M 6/5072 320/139 |
| 6,229,287 B1 | * | 5/2001 | Ferris | H02J 7/0054 320/139 |
| 6,239,578 B1 | * | 5/2001 | Schnell | G06F 1/263 320/119 |
| 6,891,355 B2 | * | 5/2005 | Kernahan | H02M 3/157 320/132 |
| 6,977,480 B2 | * | 12/2005 | Emori | B60L 11/185 320/104 |
| 7,301,308 B2 | * | 11/2007 | Aker | H02J 7/0042 320/139 |
| 2009/0309553 A1 | * | 12/2009 | Marinka-Toth | H02J 7/0093 320/155 |

FOREIGN PATENT DOCUMENTS

| | | |
|---|---|---|
| JP | 2012-016077 | 1/2012 |
| JP | 2014-090586 | 5/2014 |

* cited by examiner

*Primary Examiner* — Yalkew Fantu
(74) *Attorney, Agent, or Firm* — Greenblum & Bernstein, P.L.C.

(57) ABSTRACT

A frequency control method includes segmenting a range from a predetermined reference frequency to a predetermined lower limit frequency or a predetermined upper limit frequency into frequency range segments according to a number of battery apparatuses, detecting a current frequency of a power system, and causing battery apparatuses to charge from the power system or discharge to the power system in order to control a frequency or maintain a supply and demand balance of the power system, causing lager number of battery apparatuses to charge or discharge as a frequency range segment including the current frequency becomes farther apart from the reference frequency.

12 Claims, 18 Drawing Sheets

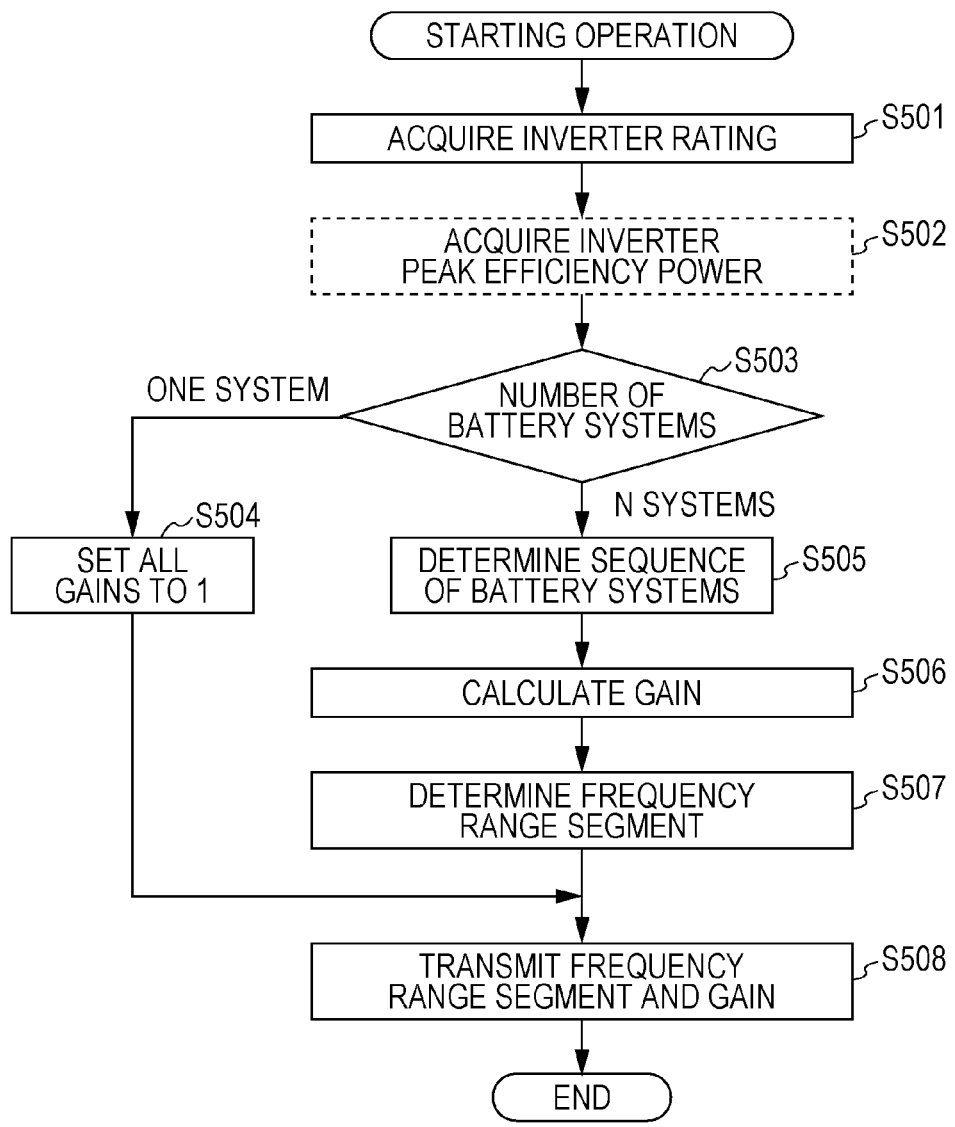

| COMMAND TO CORRECT FIRST BATTERY SYSTEM | COMMAND TO CORRECT SECOND BATTERY SYSTEM |
|---|---|
| IF $|\Delta f| \leq \Delta f1$, THEN SET GAIN TO 2<br>IF NOT, THEN SET GAIN TO 1 | IF $|\Delta f| \leq \Delta f1$, THEN SET GAIN TO 0<br>IF NOT, THEN SET GAIN TO 1 |

| COMMAND TO CORRECT<br>FIRST BATTERY SYSTEM | COMMAND TO CORRECT<br>SECOND BATTERY SYSTEM |
|---|---|
| IF $|\Delta f| \leq \Delta f1$, THEN SET GAIN TO 3<br>IF NOT, THEN SET GAIN TO 1 | IF $|\Delta f| \leq \Delta f1$, THEN SET GAIN TO 0<br>IF NOT, THEN SET GAIN TO 1 |

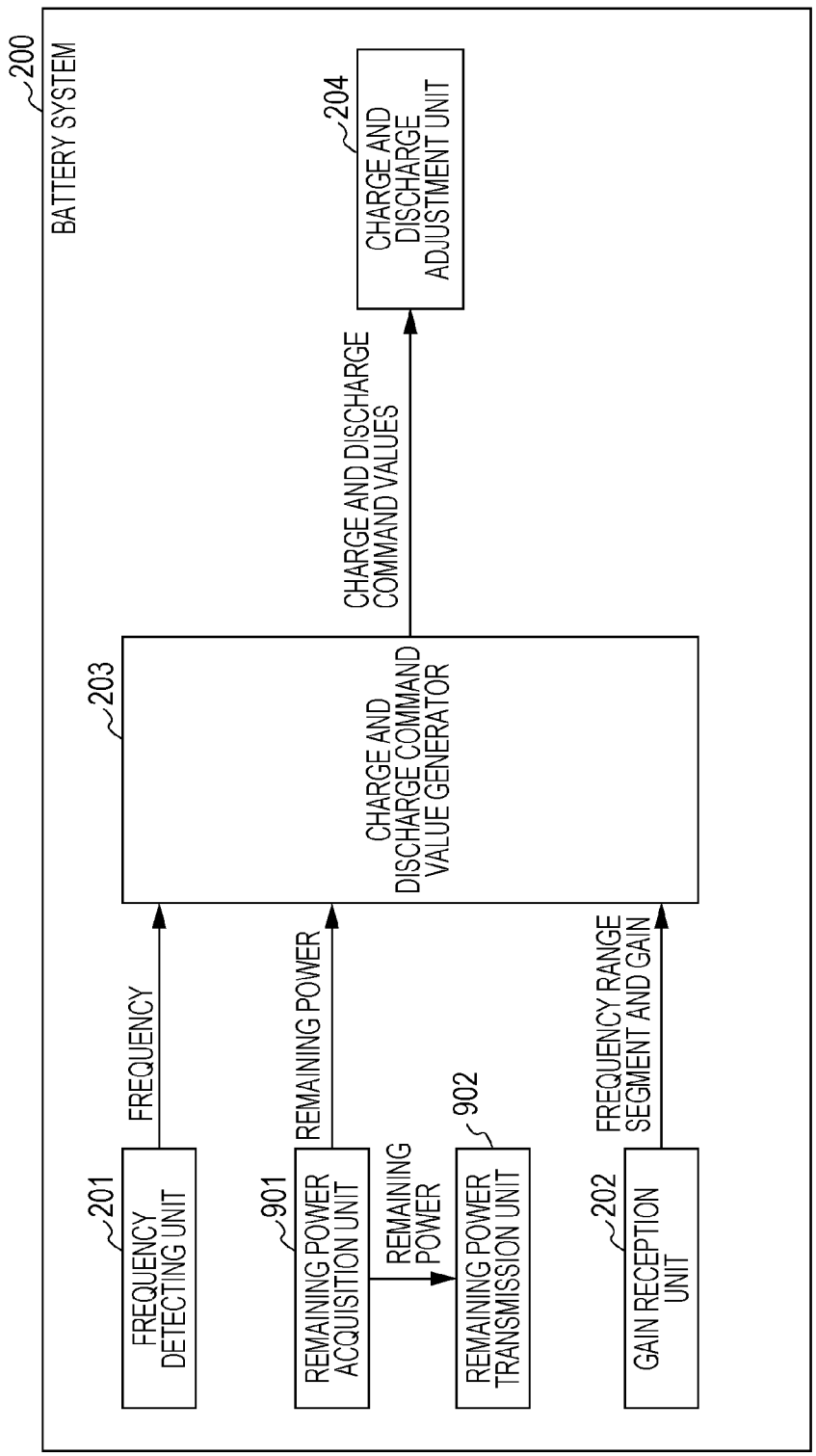

FREQUENCY CONTROL METHOD AND FREQUENCY CONTROL APPARATUS

BACKGROUND

1. Technical Field

The present disclosure relates to a frequency control system, a frequency control apparatus, a battery apparatus, and a frequency control method for control to set a frequency of a power system close to a reference frequency.

2. Description of the Related Art

Japanese Unexamined Patent Application Publication No. 2012-16077 discloses a technique that performs charge and discharge control to maintain a frequency of a power system to a reference frequency by charging power to a battery system connected to a power system or discharging power from the battery system.

In the frequency control system disclosed in Japanese Unexamined Patent Application Publication No. 2012-16077, however, the overall efficiency of the whole system including multiple batteries is not sufficiently high.

SUMMARY

One non-limiting and exemplary embodiment provides a frequency control system, a frequency control apparatus, a battery apparatus, and a frequency control method for increasing efficiency in a system including multiple battery systems.

In one general aspect, the techniques disclosed here feature a frequency control method includes segmenting a range from a predetermined reference frequency to a predetermined lower limit frequency or a predetermined upper limit frequency into frequency range segments according to a number of battery apparatuses, detecting a current frequency of a power system, and causing battery apparatuses to charge from the power system or discharge to the power system in order to control a frequency or maintain a supply and demand balance of the power system, causing lager number of battery apparatuses as a frequency range segment including the current frequency becomes farther apart from the reference frequency.

It should be noted that general or specific embodiments may be implemented as a device, a system, a method, an integrated circuit, a computer program, a storage medium such as a computer readable compact disk ROM (CD-ROM), or any selective combination thereof.

The system including the multiple batteries is thus increased in overall efficiency.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 5 is a flowchart illustrating an operation example of the frequency control apparatus of the first embodiment;

FIG. 9 is a functional block diagram illustrating another configuration of the battery system of the first embodiment;

DETAILED DESCRIPTION

The inventor has studied a parallel operation control method described in the related art section, and has found a problem in the method.

Frequency regulation (FR) to control frequency of a power system to within an appropriate range (for example, within a reference frequency 50 Hz±0.2 Hz) is performed. Japanese Unexamined Patent Application Publication No. 2012-16077 discloses a frequency control apparatus that performs charge and discharge control to maintain a frequency of a power system to a reference frequency by charging a battery system connected to the power system or discharging power from the battery system.

Since the charge and discharge efficiency of the battery system changes depending on charge and discharge power, increasing the overall efficiency in a system including multiple battery apparatuses is desirable.

The charge and discharge efficiency of the battery system is basically determined based on a conversion efficiency of an inverter in the battery apparatus and the charge and discharge efficiency of the battery. (If a direct-current (DC)-DC converter is used, the efficiency of the DC-DC converter is also considered). The inverter discharges to a power system by converting direct-current (DC) power from the battery into alternating-current (AC) power, and charges the battery by converting the AC power from the power system into DC power. The charge and discharge efficiency of the battery system is determined by the product of the conversion efficiency of the inverter and the charge and discharge efficiency of the battery.

Figure 7:
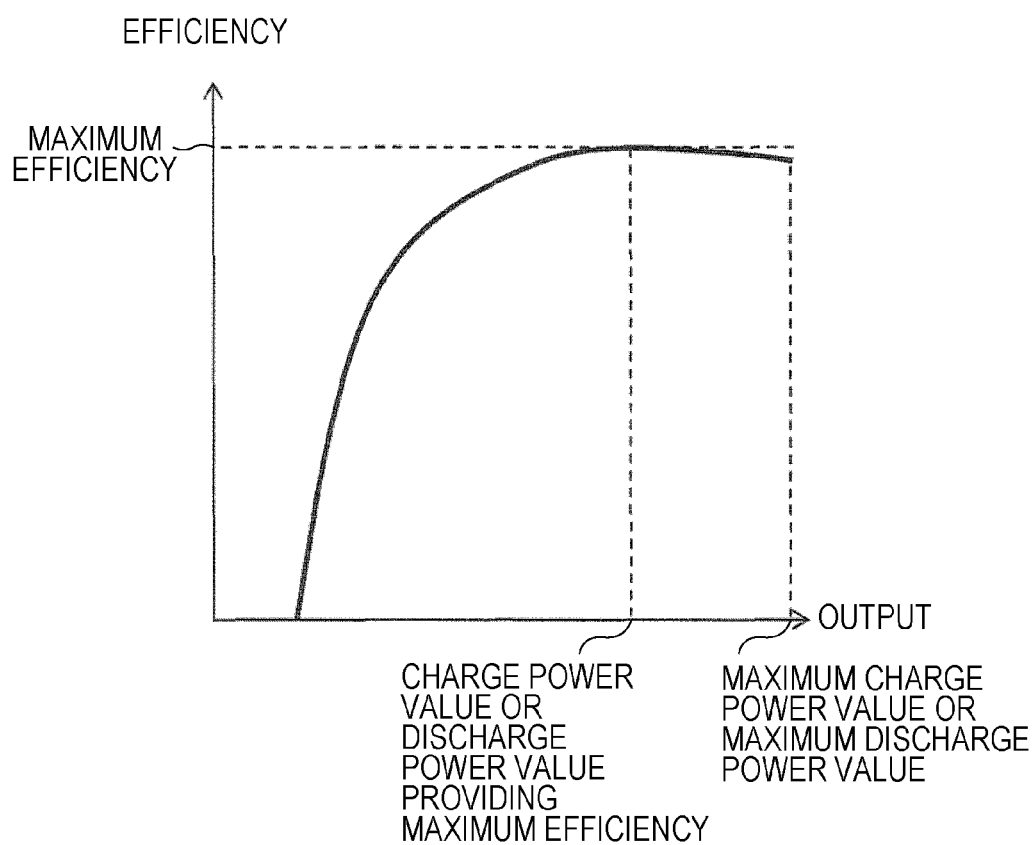
FIG. 7 illustrates the efficiency of the battery system of the first embodiment.

FIG. 7 illustrates the efficiency (the charge and discharge efficiency) of a battery system in an embodiment. The abscissa represents discharge power or charge power. The ordinate represents efficiency. Referring to FIG. 7, the efficiency of the battery system is higher if charge or discharge power is at 50 percent or higher of the maximum charge power or the maximum discharge power, and becomes smaller greatly as the charge power or the discharge power becomes lower. Since a charge and discharge command value is calculated in view of the depth of charge only in the frequency regulation described Japanese Unexamined Patent Application Publication No. 2012-16077, the overall efficiency is not necessarily high enough. The disclosure thus provides a frequency control system, a frequency control apparatus, a battery apparatus, and a frequency control method for increasing efficiency in a system including multiple batteries.

To address the problem, a frequency control method in one aspect of the disclosure controls a frequency of a power system or maintains a supply and demand balance of power in the power system through charge and discharge control of a plurality of battery apparatuses in a system including the battery apparatuses and a frequency control apparatus arranged in a distributed fashion. The frequency control method includes segmenting a range from a predetermined reference frequency to a predetermined lower limit frequency or a predetermined upper limit frequency into frequency range segments according to a number of battery apparatuses, detecting a current frequency of a power system, and causing battery apparatuses to charge from the power system or discharge to the power system in order to control a frequency or maintain a supply and demand balance of the power system, causing lager number of battery apparatuses to charge or discharge as a frequency range segment including the current frequency becomes farther apart from the reference frequency.

The smallest number of battery apparatuses performs a charge operation or a discharge operation in a frequency range segment (including the reference frequency) closest to the reference frequency from among the multiple frequency range segments while the remaining battery apparatuses remain inactive. Since the number of battery apparatuses performing the charge operation or the discharge operation for lower power applications which are typically lower in efficiency is limited, the overall efficiency of the system including the multiple battery apparatuses is increased.

the frequency range segments include a first frequency range segment and a second frequency range segment, an absolute value of a difference between a frequency in the first frequency range segment and the reference frequency is equal to zero or higher to a frequency lower than a first value, and an absolute value of a difference between a frequency in the second frequency range segment and the reference frequency is equal to the first value or larger and lower than a second value, assigning first battery apparatuses that discharge or charge in all the frequency range segments, and second battery apparatuses that discharge or charge in the frequency range segments other than the first frequency range segment, according to at least one of a degree of degradation of, a remaining power quantity of, and a frequency of use of the battery apparatuses, and causing the first battery apparatuses to discharge to the power system and causing the second battery apparatuses not to discharge to the power system, or causing the first battery apparatuses to charge from the power system and causing the second battery apparatuses not to charge from the power system, when the current frequency of the power system is within the first frequency range segment.

Since the system efficiency of the battery is lower in the first frequency range segment having a smaller frequency deviation, a single battery apparatus is caused to discharge with the remaining batteries unused. The overall system efficiency of the multiple batteries is thus increased.

As a frequency deviation between the current frequency and the reference frequency becomes larger in each of the frequency range segments, causing the first battery apparatuses to discharge power more from the first battery apparatuses to the power system, or charge power more from the power system to the first battery apparatuses, and wherein in the first battery apparatuses, a rate of increase in the discharge power or the charge power with respect to the frequency deviation in the first frequency range segment is set higher than a rate of increase in the discharge power or the charge power with respect to the frequency deviation in any other frequency range segment.

If the current frequency is closer to the reference frequency (within the first frequency range segment), the first battery apparatus is increased in the discharge power with the remaining battery apparatuses caused not to discharge. The overall efficiency is thus increased.

In the first frequency range segment, the discharge power from the first battery apparatuses to the power system increase from zero to first discharge power in accordance with the frequency deviation, and the charge power from the power system to the first battery apparatuses increase from zero to first charge power in accordance with the frequency deviation. In the second frequency range segment, the discharge power from the first battery apparatuses to the power system increase from second discharge power lower than the first discharge power to third discharge power in accordance with the frequency deviation, and the charge power from the power system to the first battery apparatus increase from second charge power lower than the first charge power to third charge power in accordance with the frequency deviation.

If the current frequency is farther from the reference frequency (within the second frequency range segment), the discharge operation of the first battery apparatus is suppressed, and the other battery apparatuses are caused to start discharge. The overall efficiency of the inverter is increased.

Each of the battery apparatuses includes a battery and an inverter that discharges to the power system by converting direct-current power from the battery into alternating-current power, or charges the battery by converting alternating-current power from the power system into direct-current power. In the controlling, as a capacity of the inverter in the first battery apparatus becomes smaller, a rate of increase in the discharge power or the charge power of the first battery apparatus in the first frequency range segment is set to higher.

Even if the inverter capacities of the multiple battery apparatuses are different from each other, the overall efficiency is increased.

In the controlling, in the second frequency range segment, a rate of increase in the discharge power from the first battery apparatus to the power system is caused to match a rate of increase in the discharge power from the second battery apparatus to the power system, and a rate of increase in the charge power from the power system to the first battery apparatus is caused to match a rate of increase in the charge power from the power system to the second battery power.

If the current frequency is farther from the reference frequency (within the second frequency range segment), the multiple battery apparatuses are caused to discharge or to be charged uniformly. The overall efficiency is thus increased.

Each value of the first discharge power and the first charge power may be a maximum rated value of the first battery apparatus.

In the first frequency range segment, only the first battery apparatus operates with the other battery apparatuses set to be inactive. Since the first battery apparatus discharges at the maximum rating or is charged at the maximum rating, the overall efficiency is increased.

Each of the battery apparatuses includes a battery and an inverter that discharges to the power system by converting direct-current power from the battery into alternating-current power, or charges the battery by converting alternating-current power from the power system into direct-current power. Each value of the first charge power and the first discharge power is power that maximizes a conversion efficiency of the inverter in the first battery apparatus, or a charge and discharge efficiency of the battery, or a product of the conversion efficiency and the charge and discharge efficiency.

In the first frequency range segment, the discharge operation or the charge operation is performed until the conversion efficiency of the inverter in the first battery apparatus, or the charge and discharge efficiency of the battery, or the product of the conversion efficiency and the charge and discharge efficiency is maximized. The overall efficiency is thus increased.

The second discharge power is discharge power at a frequency resulting from subtracting the first value from the reference frequency in discharge characteristic data where the discharge power increases from zero at the reference frequency at a predetermined rate of increase to maximum discharge power of the first battery apparatus at the lower limit frequency. The second charge power is charge power at a frequency resulting from adding the first value to the reference frequency in charge characteristic data where the charge power increases from zero at the reference frequency at a predetermined rate of increase to maximum charge power of the first battery apparatus at the upper limit frequency.

Since the second discharge power and the second charge power are not zero, the second battery apparatus avoids operating at a relatively inefficient discharge or charge operation. The overall efficiency is increased.

The controlling includes generating a correction command for each of the battery apparatuses in the frequency control apparatus, the correction command including a correction coefficient for each of the frequency range segments, transmitting to the battery apparatuses the correction commands respectively corresponding to the battery apparatuses from the frequency control apparatus, correcting a charge and discharge command value responsive to the frequency detected in the detecting in response to the correction command in each of the battery apparatuses, and discharging to the power system or charging each of the battery apparatuses from the power system in response to the corrected charge and discharge command value. The charge and discharge value respectively represents charge power or discharge power uniquely set for the frequency in the charge characteristic data or the discharge characteristic data.

The overall efficiency is thus higher in local control frequency regulation.

The controlling includes generating a correction command for each of the battery apparatuses in the frequency control apparatus, the correction command including a correction coefficient for each of the frequency range segments, correcting a charge and discharge command value responsive to the frequency detected in the detecting in response to the correction command in each of the battery apparatuses, transmitting to the battery apparatuses the corrected charge and discharge command values respectively corresponding to the battery apparatuses from the frequency control apparatus, and discharging from each of the battery apparatuses or charging each of the battery apparatuses in response to the corrected charge and discharge command values transmitted from the frequency control apparatus. The charge and discharge value respectively represents charge power or discharge power uniquely set for the frequency in the charge characteristic data or the discharge characteristic data.

The overall efficiency is higher in centralized control frequency regulation.

A frequency control apparatus in one aspect of the disclosure controls a frequency in a power system or maintains a supply and demand balance of power in the power system by charge and discharge controlling a plurality of battery apparatuses arranged in a distributed fashion. The frequency control apparatus includes one or more memories; and circuitry operative to: segment a range from a predetermined reference frequency to a predetermined lower limit frequency or a predetermined upper limit frequency into frequency range segments according to a number of battery apparatuses; detect a current frequency of a power system; and cause battery apparatuses to charge from the power system or discharge to the power system in order to control a frequency or maintain a supply and demand balance of the power system, wherein the device causes lager number of battery apparatuses to charge or discharge as a frequency range segment including the current frequency becomes farther apart from the reference frequency. A frequency control apparatus in one aspect of the disclosure controls a frequency in a power system or maintains a supply and demand balance of power in the power system by charge and discharge controlling a plurality of battery apparatuses arranged in a distributed fashion. The frequency control apparatus includes a gain calculator that segments a range from a predetermined reference frequency to a predetermine lower limit frequency or a predetermined upper limit frequency into a plurality of frequency range segments responsive to a number of the battery apparatuses, and calculates, as a gain, a correction coefficient of each of the frequency range segments in each of the battery apparatuses, a detector that detects a current frequency of the power system, a command value generator that generates a corrected charge and discharge command value by correcting a charge and discharge command value responsive to the frequency detected by the detector in accordance with the gain in each of the battery apparatuses, and a transmitter that transmits the corrected charge and discharge command value to each of the battery apparatuses. The gain calculator stores discharge characteristic data where discharge power increases from zero at the reference frequency at a predetermined rate of increase to maximum discharge power of a first battery apparatus at the lower limit frequency, and charge characteristic data where charge power increases from zero at the reference frequency at a predetermined rate of increase to maximum charge power of the first battery apparatus at the upper limit frequency. The gain as the correction coefficient is a coefficient that is to be multiplied by the charge and discharge command values. The charge and discharge value respectively represents charge power or discharge power uniquely set for the frequency in the charge characteristic data or the discharge characteristic data. The gain calculator calculates the gain such that as a frequency range segment within which the current frequency falls is farther apart from the reference frequency, the number of battery apparatuses that discharge to the power system or that are charged with power supplied from the power system increases more.

The overall efficiency is higher in the centralized control frequency regulation.

A system in one aspect of the disclosure includes the frequency control apparatus and a plurality of battery apparatuses. Each of the battery apparatuses includes a receiver that receives the corrected charge and discharge command value from the frequency control apparatus, a battery, and an inverter that, in response to the corrected charge and discharge command value, discharges to the power system by converting direct-current power from the battery into alternating-current power, or charges the battery by converting alternating-current power from the power system into direct-current power.

The overall efficiency is higher in the centralized control frequency regulation.

A frequency control apparatus in one aspect of the disclosure controls a frequency in a power system or maintains a supply and demand balance of power in the power system by charge and discharge controlling a plurality of battery apparatuses arranged in a distributed fashion. The frequency control apparatus includes a gain calculator that segments a range from a predetermined reference frequency to a predetermine lower limit frequency or a predetermined upper limit frequency into a plurality of frequency range segments responsive to a number of the battery apparatuses, and calculates, as a gain, a correction coefficient of each of the frequency range segments in each of the battery apparatuses, and a transmitter that transmits the gain at each frequency range segment to each of the battery apparatuses. The gain as the correction coefficient is a coefficient that is to be multiplied by a charge and discharge command value. The charge and discharge value respectively represents charge power or discharge power uniquely set for the frequency in charge characteristic data or discharge characteristic data. The discharge characteristic data represents discharge characteristics where discharge power increases from zero at the reference frequency at a predetermined rate of increase to maximum discharge power of a first battery apparatus at the lower limit frequency. The charge characteristic data represents charge characteristics where charge power increases from zero at the reference frequency at a predetermined rate of increase to maximum charge power of the first battery apparatus at the upper limit frequency. The gain calculator calculates the gain such that as a frequency range segment within which a current frequency falls is farther apart from the reference frequency, the number of battery apparatuses that discharge to the power system or that are charged with power supplied from the power system increases more.

The overall efficiency is thus higher in the local control frequency regulation.

A battery apparatus in one aspect of the disclosure controls a frequency in a power system or maintains a supply and demand balance of power in the power system by charging from and discharging to the power system. The battery apparatus includes a detector that detects a current frequency in the power system, a receiver that receives a gain of each frequency range segment from a frequency control apparatus, a command value generator that generates a corrected charge and discharge command value by correcting a charge and discharge command value responsive to the frequency detected by the detector in accordance with the gain, a battery, and an inverter that, in response to the corrected charge and discharge command value, discharges to the power system by converting direct-current power from the battery into alternating-current power, or charges the battery by converting alternating-current power from the power system into direct-current power. The command value generator stores discharge characteristic data where discharge power increases from zero at a reference frequency at a predetermined rate of increase to maximum discharge power of the battery apparatus at a lower limit frequency, and charge characteristic data where charge power increases from zero at the reference frequency at a predetermined rate of increase to maximum charge power of the battery apparatus at an upper limit frequency. The gain as the correction coefficient is a coefficient that is to be multiplied by the charge and discharge command values. The charge and discharge values prior to correction respectively represents charge power or discharge power uniquely set for the frequency in the charge characteristic data or the discharge characteristic data.

The overall efficiency is higher in the local control frequency regulation.

A system in one aspect of the disclosure includes the frequency control apparatus, and the battery apparatus.

The overall efficiency is higher in the local control frequency regulation.

It should be noted that general or specific embodiments may be implemented as a system, a method, an integrated circuit, a computer program, a storage medium such as a computer readable compact disk ROM (CD-ROM), or any selective combination thereof.

Embodiments are described with respect to the drawings.

The embodiments described below are specific examples of the disclosure. Values, shapes, materials, elements, mounting locations, connection form, steps, and order of steps in the embodiments are described for exemplary purposes only, and are not intended to limit the disclosure. Among the elements in the embodiment, elements not described in the independent claims indicative of higher concepts may be any arbitrary element. The embodiments may also be combined.

First Embodiment

A frequency control apparatus of a first embodiment that controls the frequency of a power system using a battery system closer to a reference frequency is described below. The battery system is also referred to as a battery apparatus.

Figure 1:
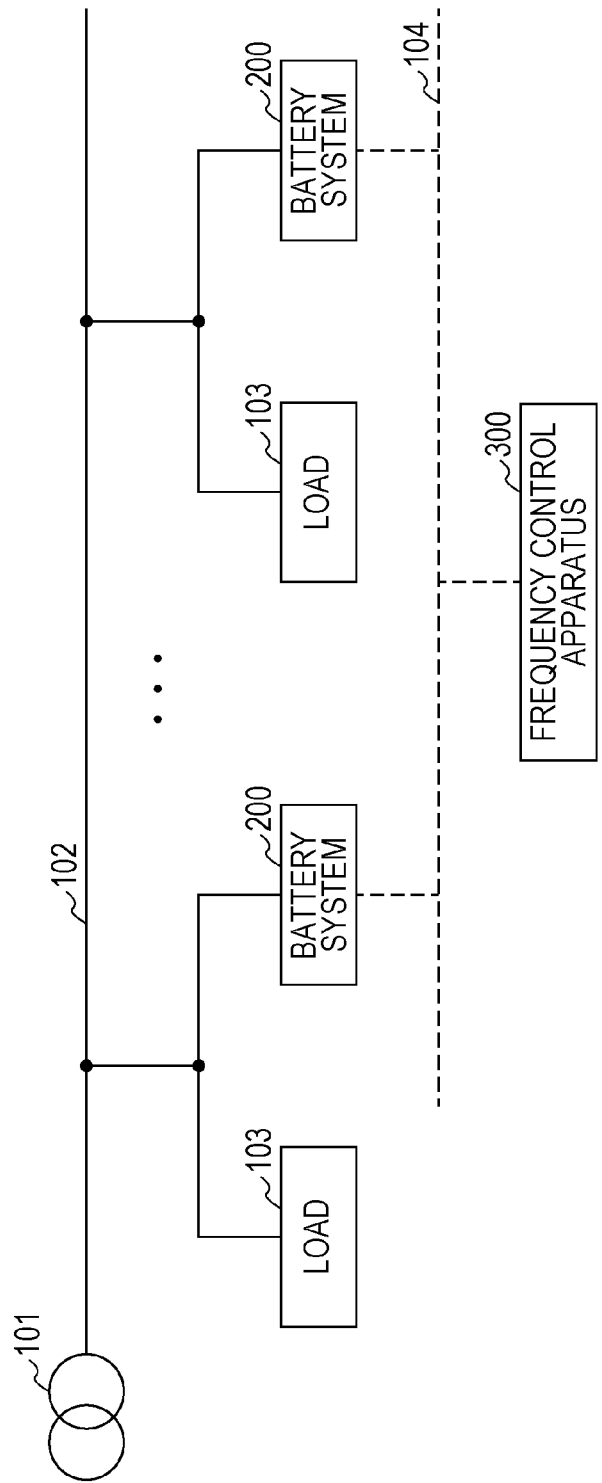
FIG. 1 is a block diagram of a power system including a frequency control apparatus in a first embodiment.

FIG. 1 is a block diagram of the power system including the frequency control apparatus in the first embodiment.

Referring to FIG. 1, the power system includes a distribution transformer 101, a distribution line 102, a load 103, a communication network 104, a battery system 200, and a frequency control apparatus 300.

The distribution transformer 101 converts power supplied from a higher system to power at a voltage level appropriate to be supplied to the load 103.

The distribution line 102 electrically connects the distribution transformer 101 to the load 103 to supply the power from the distribution transformer 101 to the load 103.

The load 103 is an apparatus owned by a high-voltage customer or a low-voltage customer, and consumes power. For example, the load 103 is consumer electronics.

The communication network 104 connects the frequency control apparatus 300 to the battery system (storage battery system) 200 for communication. For example, the communication network 104 may be implemented by a public communication network including a wired local-area network (LAN) complying with IEEE802.3 Standard, and a radio LAN, and a cellular phone network complying with IEEE802.11a, 11b, and 11g standards.

The battery system 200 charges a battery with power supplied from the power system, or discharges to the power system with power. By performing the charge operation or the discharge operation, the battery system 200 controls the frequency of the power supplied by the power system close to a reference frequency. The reference frequency is 50 Hz, for example.

The battery system 200 includes a battery and an inverter that performs an AC-to-DC conversion operation to charge the battery, and performs a DC-to-AC conversion operation to discharge power from the battery.

The battery system 200 detects the frequency of the power supplied from the power system, and calculates a charge and discharge command value that controls the frequency of the power from the power system closer to the reference frequency. The battery system 200 corrects the charge and discharge command value by multiplying the charge and discharge command value by a gain allotment received from the frequency control apparatus 300, and then performs the charge and discharge operations in accordance with the corrected charge and discharge command values.

The frequency control apparatus 300 calculates frequency range segments and the gain allotment based on the inverter rating of the battery system 200 or a power value that results in the maximum inverter efficiency, and then transmits the frequency range segment and gain allotment to the battery system 200.

FIG. 1 illustrates a system example only. The battery system 200 may be connected to the distribution line 102 without the load 103. The battery system 200 may be connected to a system higher than the distribution transformer 101.

Figure 2:
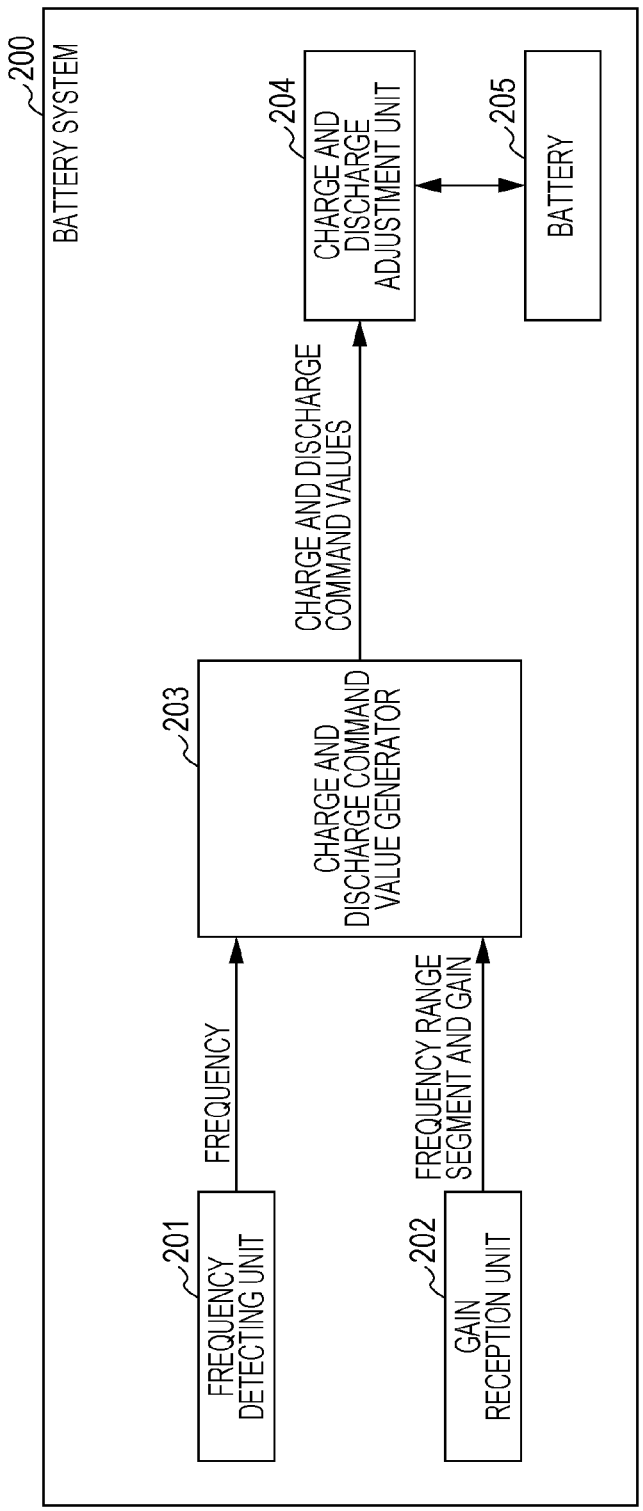
FIG. 2 is a functional block diagram illustrating the configuration of a battery system of the first embodiment.

FIG. 2 is a functional block diagram illustrating the configuration of the battery system of the first embodiment. As illustrated in FIG. 2, the battery system 200 includes a frequency detecting (frequency measuring) unit 201, a gain reception unit 202, a charge and discharge (charge/discharge) command value generator (generation unit) 203, a charge and discharge (charge/discharge) adjustment unit 204, and a battery (storage battery) 205.

The frequency detecting unit 201 detects the frequency of the power system, and transfers the detected frequency to the charge and discharge command value generator 203. The power system supplies AC power at a frequency closer to the reference frequency (50 Hz or 60 Hz, hereinafter the reference frequency is 50 Hz). The frequency of the supplied power varies depending on the supply and demand balance. More specifically, if the demand for power is higher than the supply of power, the frequency of the power system decreases and falls to 49.9 Hz or 49.8 Hz, for example. Conversely, if the supply of power is higher than the demand for power, the frequency of the power system increases and rises to 50.1 or 50.2 Hz, for example. As described above, the frequency of the power system varies constantly, and the frequency detecting unit 201 detects such a varying frequency of the power system. In order to perform frequency control without interruption, the frequency detecting unit 201 periodically detects the frequency (every second, for example).

The gain reception unit 202 receives the frequency range segment and gain from the frequency control apparatus 300, and then transfers the frequency range segment and gain to the charge and discharge command value generator 203. For example, the gain reception unit 202 receives the frequency range segment and gain, such as (equal to or below 49.9 Hz, 1), (49.9 Hz to 50.1 Hz, 2), or (equal to or above 50.1 Hz, 1).

The charge and discharge command value generator 203 calculates the charge and discharge command value based on the frequency received from the frequency detecting unit 201 such that the frequency of the power of the power system becomes closer to the reference frequency 50 Hz. For example, the charge and discharge command value calculated may now be 50 kW. The calculation method is described below. The charge and discharge command value generator 203 multiplies the charge and discharge command value by the gain allotment received by the gain reception unit 202, thereby correcting the charge and discharge command value. If the frequency segment received from the frequency detecting unit 201 is 49.9 Hz, (49.9 to 50.1 Hz, 2) received from the gain reception unit 202 is applicable. The charge and discharge command value generator 203 multiplies 50 kW by the gain (=2), thereby correcting the charge and discharge command value to 100 kW. (However, note that the charge and discharge command value rated output of the battery system holds). The corrected charge and discharge command value is transferred to the charge and discharge adjustment unit 204.

The charge and discharge adjustment unit 204 includes a bidirectional inverter that converts the DC power from the battery 205 into the AC power, and discharges to the power system, or converts the AC power from the power system to the DC power to charge the battery 205. The charge and discharge adjustment unit 204 thus performs the charge and discharge operation by controlling the inverter in response to the charge and discharge command value received from the charge and discharge command value generator 203.

The battery 205 is a rechargeable battery that is enabled to be charged and to discharge.

Figure 3:
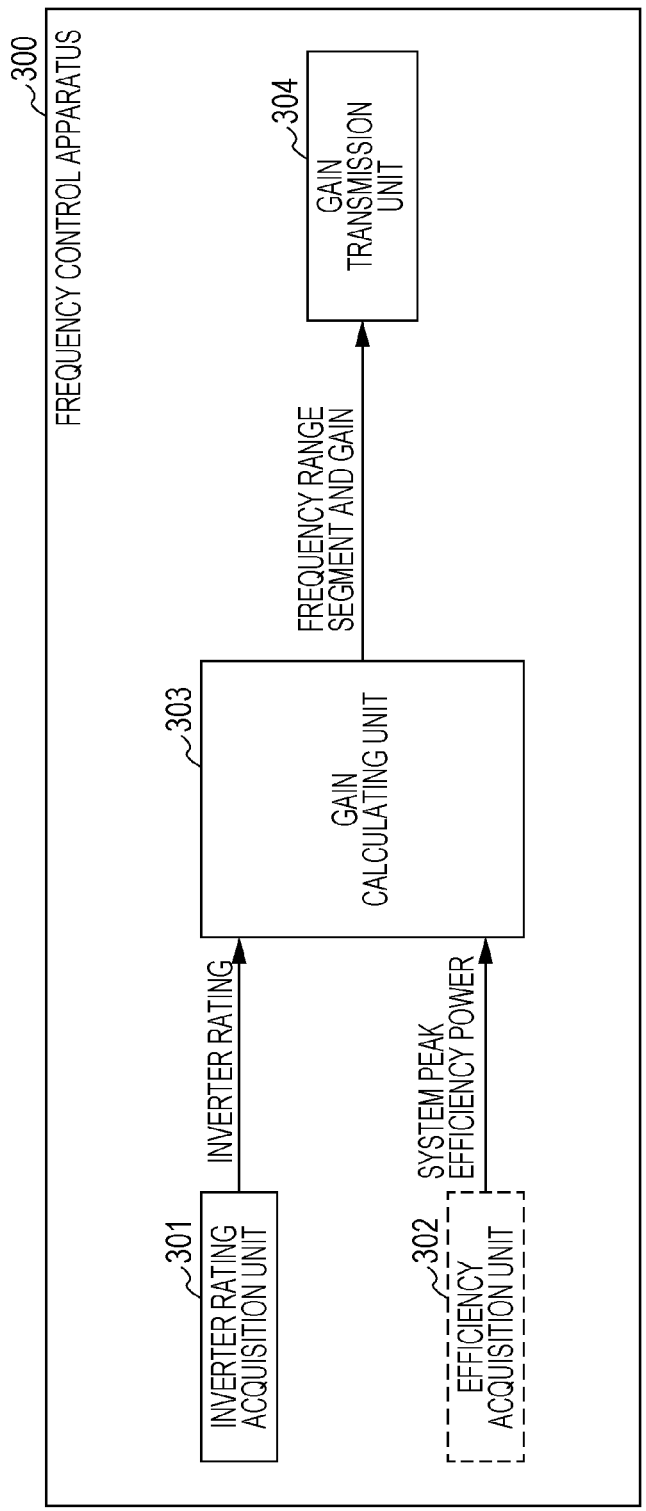
FIG. 3 is a functional block diagram illustrating the configuration of the frequency control apparatus of the first embodiment.

FIG. 3 is a functional block diagram illustrating the configuration of the frequency control apparatus 300 of the first embodiment.

Referring to FIG. 3, the frequency control apparatus 300 includes an inverter rating acquisition unit 301, an efficiency acquisition unit 302, a gain calculating unit 303, and a gain transmission unit 304.

The inverter rating acquisition unit 301 acquires the rated capacity of the inverter of the battery system 200, and then transfers the rating to the gain calculating unit 303. The inverter rating acquisition unit 301 may acquire the rated capacity of the inverter from the battery system 200 via the communication network 104. Alternatively, the rated capacity may be stored on a memory (not illustrated), and the inverter rating acquisition unit 301 may read the rated capacity from the memory. The rated capacity may be 100 kW, for example.

The efficiency acquisition unit 302 acquires an output power value that maximizes the efficiency of the battery system 200 and then transfers the output power value to the gain calculating unit 303. The efficiency of the battery system 200 is a value resulting from multiplying the efficiency of the battery by the efficiency of the inverter (namely, the conversion efficiency). The efficiency of the battery system 200 may set to be the efficiency of the inverter. The efficiency acquisition unit 302 may acquire the output power value maximizing the efficiency from the battery system 200 via the communication network 104. Alternatively, the output power value maximizing the efficiency may be stored on a memory (not illustrated), and the efficiency acquisition unit 302 may read the output power value from the memory. If the inverter rating acquired by the inverter rating acquisition unit 301 is used in the calculation of the gain, the system may dispense with the efficiency acquisition unit 302.

The gain calculating unit 303 calculates the frequency range segment and gain based on the inverter rating acquired by the inverter rating acquisition unit 301, and the output power value maximizing the efficiency and acquired by the efficiency acquisition unit 302. The calculation method is described in detail below. The gain transmission unit 304 transmits the frequency range segment and gain calculated by the gain calculating unit 303 to the battery system 200 via the communication network 104.

Figure 4:
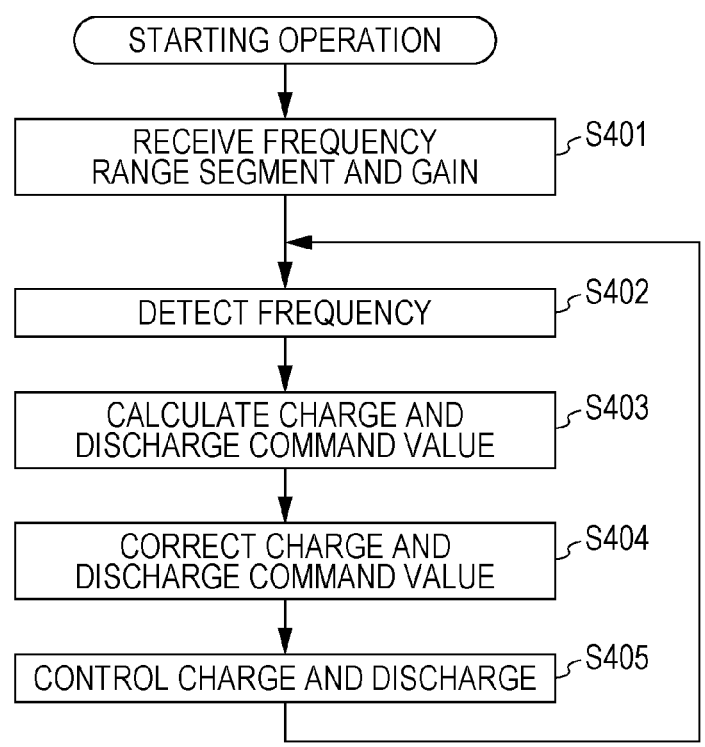
FIG. 4 is a flowchart illustrating an operation example of the battery system of the first embodiment.

FIG. 4 is a flowchart illustrating an operation example of the battery system of the first embodiment.

In step S401, the gain reception unit 202 receives the frequency range segment and gain. The gain reception unit 202 receives the frequency range segment and gain before starting the frequency control.

In step S402, the frequency detecting unit 201 detects the frequency of the power system.

In step S403, the charge and discharge command value generator 203 calculates the charge and discharge command value based on the frequency received from the frequency detecting unit 201. The charge and discharge command value is to set the frequency of the power of the power system to be closer to the reference frequency 50 Hz. More specifically, the charge and discharge command value is determined in accordance with the following formula (1). A positive charge and discharge command value in formula (1) is a discharge command value, and a negative charge and discharge value in formula (1) is a charge command value.

$$\text{Charge and discharge command value} = (-1) \times (\text{frequency deviation}) \div (\text{permissible frequency deviation}) \times (\text{inverter capacity}) \quad (1)$$

The frequency deviation is determined in accordance with the following formula (2). The permissible frequency deviation is determined in accordance with the following formula (3). If the reference frequency is 50 Hz, and an appropriate frequency range segment is 50 Hz±0.2 Hz, the permissible frequency deviation is 0.2 Hz.

$$\text{Frequency deviation} = (\text{detected frequency}) - (\text{reference frequency}) \quad (2)$$

$$\text{Permissible frequency deviation} = \text{abs}((\text{maximum value or minimum value of appropriate frequency range}) - (\text{reference frequency})) \quad (3)$$

Note that if the relationship of abs (frequency deviation)>permissible frequency deviation holds, (frequency deviation)=sign (frequency deviation)×(permissible frequency deviation). In other words, the charge and discharge command value remains below the inverter capacity.

In step S404, the charge and discharge command value generator 203 corrects the charge and discharge command value by multiplying the charge and discharge command value calculated in step S403 by the gain allotment received from the gain reception unit 202. More specifically, the charge and discharge command value is corrected in accordance with the following formula (4):

$$\text{Charge and discharge command value} = (\text{charge and discharge command value}) \times (\text{gain}) \quad (4)$$

In step S405, the charge and discharge adjustment unit 204 performs the charge and discharge operation by controlling the inverter in response to the charge and discharge command value received from the charge and discharge command value generator 203. Subsequent to step S405, processing returns to step S402.

The frequency segment and gain may be periodically received. More specifically, subsequent to step S405, processing may return to step S401.

FIG. 5 is a flowchart illustrating an operation example of the frequency control apparatus 300 of the first embodiment.

In step S501, the inverter rating acquisition unit 301 acquires the rated capacity of the inverter of the battery system 200.

In step S502, an output power value maximizing the efficiency is acquired. If the inverter rating acquired by the inverter rating acquisition unit 301 is used in the calculation of the gain, the operation in step S502 is skipped.

If the number of the battery systems as control targets is one (one battery system in step S503), all the gains are set to be 1 (step S504). For example, equal to or below 49.9 Hz, 1), (49.9 Hz to 50.1 Hz, 1), or (equal to or above 50.1 Hz, 1). In this way, the operations of the battery systems are thus set to be common regardless of the number of the battery systems as the control targets.

If the number of battery systems as the control targets is plural (N battery systems in step S503), the gain calculating unit 303 determines the sequence of the battery systems (step S505). The first battery system in the sequence is interpreted as a battery system that performs the charge and discharge operation in each of the multiple frequency range segments. The second battery system in the sequence is interpreted as a battery system that performs the charge and discharge operation in the frequency range segments other than a first frequency range segment. The third battery system in the sequence is interpreted as a battery system that performs the charge and discharge operation in the frequency range segments other than the first frequency range segment and second frequency range segment, and so forth.

More specifically, given the same inverter capacity of the battery systems, the battery systems are selected in the order from a battery system having a small degree of degradation to a battery system a large degree of degradation, or in the order from a battery system having high remaining power to a battery system having low remaining power. Alternatively, the battery systems may be selected in the order from a battery system having a high frequency of use to a battery system having a low frequency of use or may be selected vice versa.

If the battery systems are different in terms of inverter capacity, the battery systems are selected, namely, in the order from a battery system having a low inverter capacity to a battery system having a high inverter capacity, or in the order from a battery system having a high inverter capacity to a battery system having a low inverter capacity, depending on the calculation method of the overall efficiency of the inverter. More specifically, if the overall efficiency of the inverters is the mean value of the inverter efficiencies of the battery systems, the battery systems are selected in the order from a battery system having a low inverter capacity to a battery system having a high inverter capacity. If the overall efficiency of the inverters is the weighted average mean value of the inverter efficiencies of the battery systems, the battery systems are selected in the order from a battery system having a high inverter capacity to a battery system having a low inverter capacity.

In step S506, the gain calculating unit 303 calculates the gain. More specifically, the gain calculating unit 303 calculates as the gain the correction coefficient for each of the multiple frequency range segments. The gain as the correction coefficient is to be multiplied by the charge and discharge command value. If the inverter rating acquired by the inverter rating acquisition unit 301 is used in the calculation of the gain, the gain of each battery system 200 in each frequency range segment is calculated in accordance with formulas (5) and (6).

$$\text{Gain of the battery system 200 used in an } i\text{-th frequency range segment} = (\text{sum of inverter ratings of all the battery systems 200}) \div (\text{sum of inverter ratings of battery systems 200 used in the } i\text{-th frequency range segment}) \quad (5)$$

$$\text{Gain of the battery system 200 not used in the } i\text{-th frequency range segment} = 0 \quad (6)$$

More specifically, the inverter rating acquired by the inverter rating acquisition unit 301 may now be used to calculate the gain with two 100 kW battery systems. In the first frequency range segment with the single battery system operating, (100 kW+100 kW)÷(100 kW), and the gain of the first battery system 200 is 2. In accordance with formula (6), the gain of the second battery system 200 is 0. In the second frequency range segment with two battery systems operating, (100 kW+100 kW)÷200 kW, and the gain of each battery system is 1.

In step S507, the gain calculating unit 303 calculates the frequency range segment. For example, the frequency range segment is calculated using the gain calculated in step S506.

The first frequency range segment is from ((reference frequency)−(permissible frequency deviation)÷(gain)) to ((reference frequency)+(permissible frequency deviation)÷(gain)).

The i-th (i>1) frequency range segment is from ((lower limit value of (i−1)-th frequency range segment)−(permissible frequency deviation)÷(gain)) to (lower limit value of (i−1)-th frequency range segment) and from (upper limit value of (i−1)-th frequency range segment) to ((upper limit value of (i−1)-th frequency range segment)+(permissible frequency deviation)÷(gain)). Note that if the frequency deviates from the frequency upper limit value or the frequency lower limit value, the frequency upper limit value of the i-th frequency range segment is set to be the frequency upper limit value, or the frequency lower limit value of the i-th frequency range segment is set to be the frequency lower limit value.

In step S506, the gain is calculated such that as a frequency range segment within the current frequency falls, from among the frequency range segments, is farther from the reference frequency, the number of battery apparatuses that discharge to the power system or that are charged with power supplied from the power system increases more.

More specifically, the first frequency range segment with the single apparatus operating therewithin is from 50 Hz−(0.2 Hz÷2)=49.9 Hz to 50 Hz+(0.2 Hz÷2)=50.1 Hz. The second frequency range segment with the two apparatuses operating therewithin is from 49.8 Hz to 49.9 Hz, and from 50.1 Hz to 50.2 Hz.

If the system efficiency peak power acquired by the efficiency acquisition unit 302 is used in the calculation of the gain in step S507, the gain calculating unit 303 calculates the frequency range segment as described below.

The first frequency range segment is from ((reference frequency)−(permissible frequency deviation)÷(gain)×((system efficiency peak)÷(inverter rating))) to ((reference frequency)+(permissible frequency deviation)÷(gain)×((system efficiency peak)÷(inverter rating))).

The i-th (i>1) frequency range segment is from ((lower limit value of (i−1)-th frequency range segment)−(permissible frequency deviation)÷(gain)×((system efficiency peak)÷(inverter rating))) to (lower limit value of (i−1)-th frequency range segment) and from (upper limit value of (i−1)-th frequency range segment) to ((upper limit value of (i−1)-th frequency range segment)+(permissible frequency deviation)÷(gain)×((system efficiency peak)÷(inverter rating))). Note that if the frequency deviates from the frequency upper limit value or the frequency lower limit value, the frequency upper limit value of the i-th frequency range segment is set to be the frequency upper limit value, or the frequency lower limit value of the i-th frequency range segment is set to be the frequency lower limit value.

In step S508, the gain transmission unit 304 transmits the frequency range segment and gain calculated by the gain calculating unit 303 to the battery system 200 via the communication network 104.

FIG. 6A through FIG. 6D illustrate a determination method of the gain in accordance with the first embodiment. In this example, the two battery systems 200 are used with the same inverter rating (100 kW). Also note that the inverter rating is used to calculate the gain.

Figure 6A:
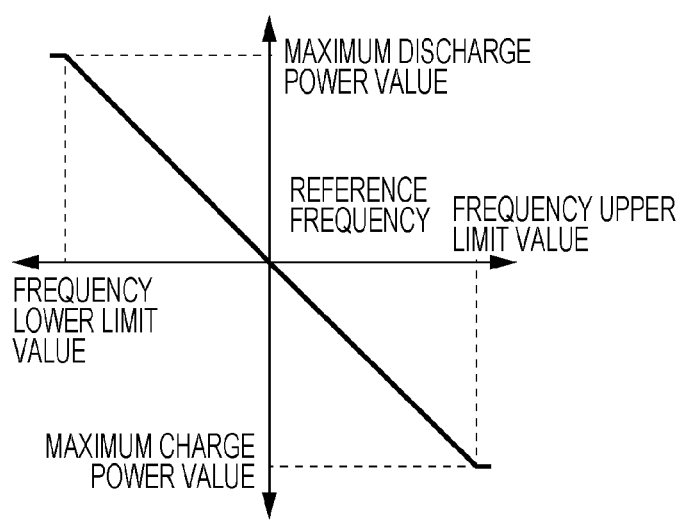
FIG. 6A through FIG. 6D illustrate a determination method of gain in accordance with the first embodiment.

FIG. 6A graphically illustrates formula (1). The abscissa represents measured frequency (may also represent frequency deviation) while the ordinate represents the charge and discharge command value with respect to the frequency. The charge and discharge command value at the upper limit frequency value is a maximum charge value, and the charge and discharge command value at the lower limit frequency value is a maximum discharge value. The charge and discharge command value is 0 at the reference frequency. FIG. 6A and formula (1) are described for exemplary purposes only, and the disclosure is not limited to these examples. The charge and discharge command value indicates charge or discharge power uniquely determined with respect to the frequency in charge characteristic data and discharge characteristic data. The discharge characteristic data indicates discharge characteristics where the discharge power is zero at the reference frequency, is maximized at the lower limit frequency value in the first battery apparatus, and increases at a predetermined rate of increase from zero to the maximum discharge power. The discharge characteristic data corresponds to discharge characteristics on the second quadrant (top left region) of FIG. 6A.

The charge characteristic data indicates charge characteristics where the charge power is zero at the reference frequency, is maximized at the upper limit frequency value in the first battery apparatus, and increases at a predetermined rate of increase from zero to the maximum charge power. The charge characteristic data corresponds to charge characteristics on the fourth quadrant (bottom right region) of FIG. 6A.

Referring to FIG. 6A, the charge and discharge command value varies linearly. Alternatively, the charge and discharge command value may vary in a stepwise fashion or in a curved fashion.

Figure 6B:
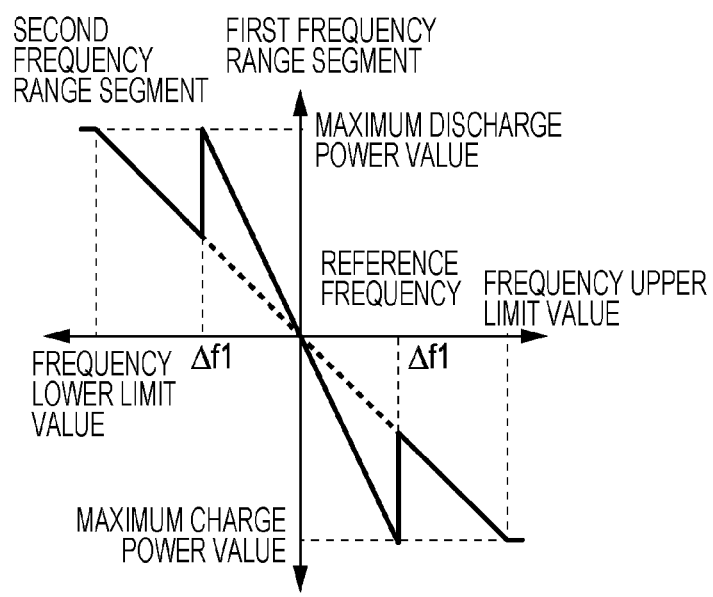
Figures 6C, 6D:
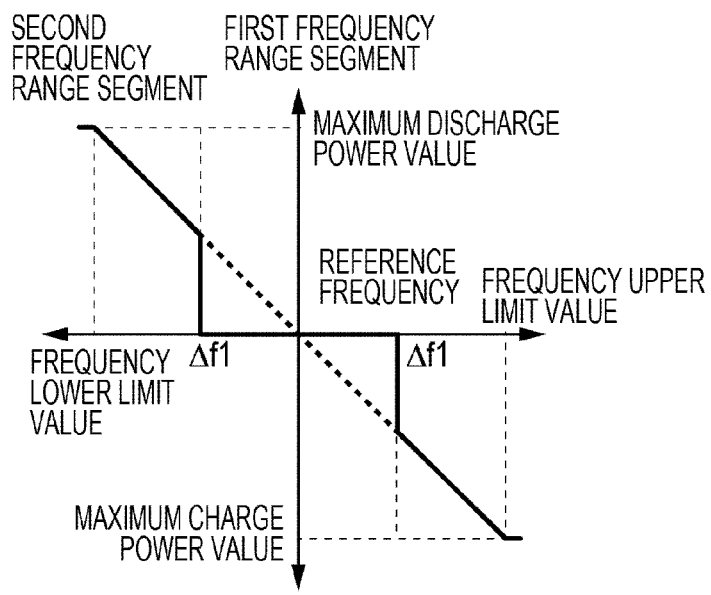

FIG. 6B illustrates a correction method of the first battery system, and FIG. 6C illustrates a correction method of the second battery system. The abscissa represents measured frequency while the ordinate represents the charge and discharge command value with respect to the frequency. For convenience of explanation, the following discussion focuses on the case in which the frequency is lower than the reference frequency.

As illustrated in FIG. 6B, in the first frequency range segment, a corrected charge and discharge command value (solid line) is twice as large as a charge and discharge command value (broken line). This is because the charge and discharge command value is multiplied by a gain of 2 (=(100 kW+100 kW)÷100 kW). In FIG. 6C, in the first frequency range segment, a corrected charge and discharge command value (solid line) is 0 with respect to a charge and discharge command value (broken line). This is because the charge and discharge command value is multiplied by a gain of 0. In a range where discharge is smaller in power (within the first frequency range segment), only the first battery system discharges. The first battery system thus performs the discharge operation at a higher efficiency region.

As illustrated in FIG. 6B and FIG. 6C, in the second frequency range segment, the charge and discharge command value (broken line) matches the corrected charge and discharge command value (solid line). This is because the gain is 1 (the gain=(100 kW+100 kW)÷200 kW).

As illustrated in FIG. 6B and FIG. 6C, in the second frequency range segment, the charge and discharge command value in the first battery system is set to be equal to the charge and discharge command value in the second battery system. In other words, the gain is set to be 1 in each case. The disclosure is not limited to this setting. For example, in a given range segment, the gain of the first battery system may be set to be 1.5 and the gain of the second battery system may be set to be 0.5.

FIG. 7 illustrates the efficiency of the battery system of the first embodiment.

The abscissa represents the magnitude of charge or discharge power while the ordinate represents the efficiency of the battery system 200 with respect to the magnitude of charge or discharge power. Typically, the efficiency becomes higher as the magnitude of charge or discharge power becomes larger. But the output power value maximizing the efficiency is not a charge power maximum value (a discharge power maximum value). In the example of FIG. 7, about 70 to 80 percent of the charge power maximum value (or the discharge power maximum value) maximizes the efficiency. The maximum efficiency is typically 90 percent or higher, and is 95 percent, for example.

FIG. 7 illustrates an example only, and the multiple battery systems do not necessarily match each other in the efficiency curve. In a given battery system, the efficiency curve during the charge operation does not necessarily match the efficiency curve during the discharge operation. In such a case, different gains may be set from the charge operation to the discharge operation. In the first embodiment, the efficiency of the battery system 200 is a product of the efficiency of the battery and the inverter efficiency. The disclosure is not limited to this arrangement. For example, the efficiency of the battery system 200 may be set to be the inverter efficiency.

FIG. 8A through FIG. 8D illustrate the determination method of the gain in accordance with the first embodiment. Two battery systems 200 different in inverter capacity may be used herein. The inverter capacity of the second battery system is set to be 200 kW, namely, twice as high as the inverter capacity of the first battery system (100 kW). The battery systems may be selected in the order from low to high inverter capacity. In other words, the first battery system is selected first.

Figure 8A:
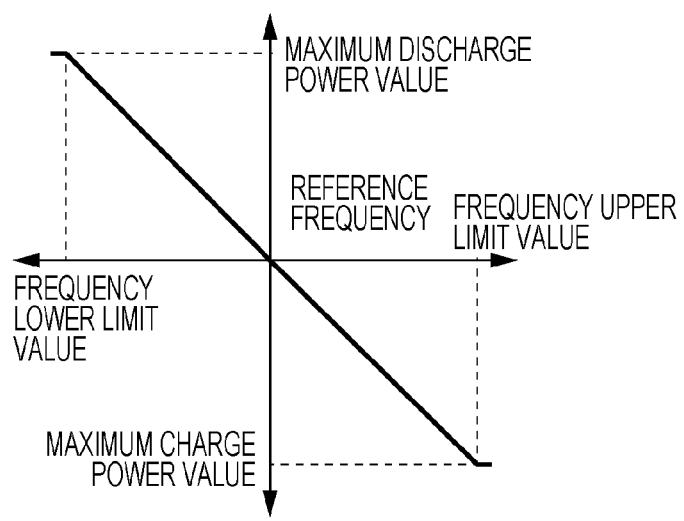
FIG. 8A through FIG. 8D illustrate a determination method of gain in accordance with the first embodiment.

FIG. 8A graphically illustrates formula (1). The abscissa represents measured frequency while the ordinate represents the charge and discharge command value with respect to the frequency. The charge and discharge command value has a maximum charge value at the upper limit frequency value while having a maximum discharge value at the lower limit frequency value. The charge and discharge command value is 0 at the reference frequency. FIG. 8A and formula (1) are described for exemplary purposes only, and the disclosure is not limited thereto.

Figure 8B:
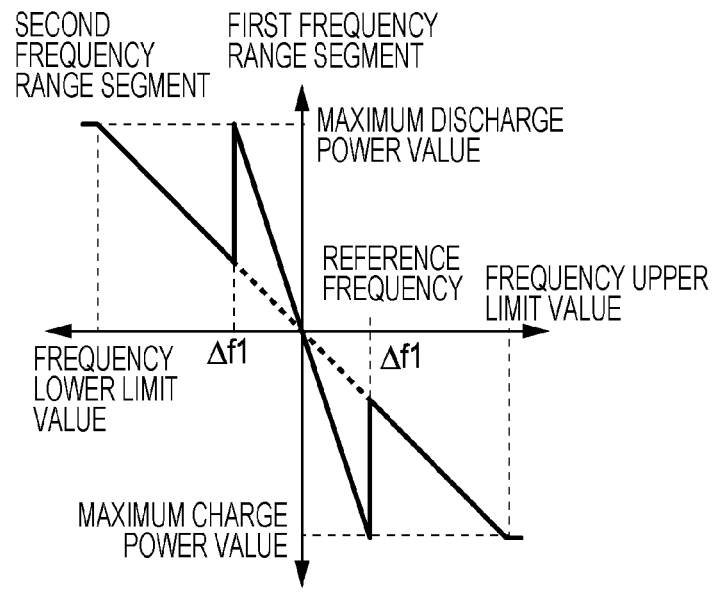
Figures 8C, 8D:
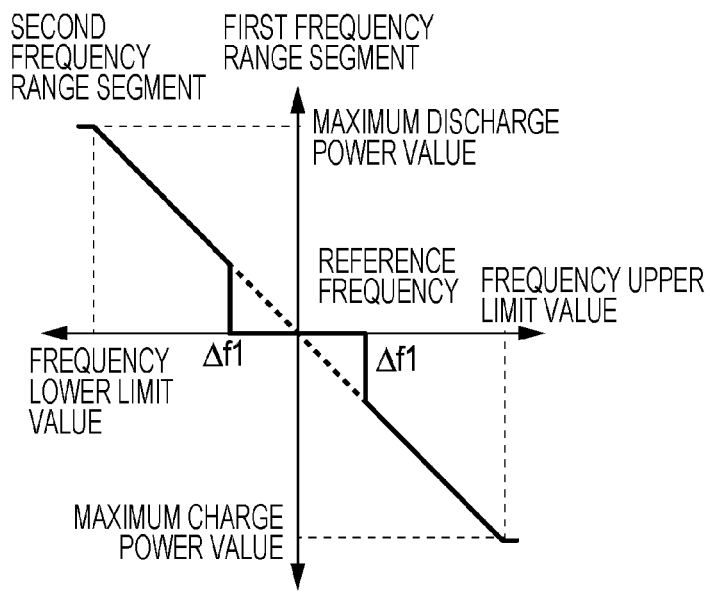

FIG. 8B illustrates the correction method of the first battery system, and FIG. 8C illustrates the correction method of the second battery system. The abscissa represents measured frequency while the ordinate represents the charge and discharge command value with respect to the frequency. For convenience of explanation, the following discussion focuses on the case in which the frequency is lower than the reference frequency.

As illustrated in FIG. 8B, in the first frequency range segment, a corrected charge and discharge command value (solid line) is three times as large as a charge and discharge command value (broken line). This is because the charge and discharge command value is multiplied by a gain of 3 (the gain=(100 kW+200 kW)÷100 kW). In FIG. 8C, in the first frequency range segment, a corrected charge and discharge command value (solid line) is 0 with respect to a charge and discharge command value (broken line). This is because the charge and discharge command value is multiplied by a gain of 0. In a range where discharge is smaller in power (within the first frequency range segment), only the first battery system discharges. The first battery system thus performs the discharge operation at a higher efficiency region.

As illustrated in FIG. 8B and FIG. 8C, in the second frequency range segment, the charge and discharge command value (broken line) matches the corrected charge and discharge command value (solid line). This is because the gain is 1 (the gain=(100 kW+200 kW)÷300 kW).

As illustrated in FIG. 8B and FIG. 8C, in the second frequency range segment, the charge and discharge command value in the first battery system is set to be equal to the charge and discharge command value in the second battery system. In other words, the gain is set to be 1 in each case. The disclosure is not limited to this setting. For example, in a given range segment, the gain of the first battery system may be set to be 0.5 and the gain of the second battery system may be set to be 1.25.

FIG. 9 is a functional block diagram illustrating another configuration of the battery system 200 of the first embodiment. Elements identical to those described with reference to FIG. 2 are designated with the same reference numerals and the detail discussion thereof is omitted herein.

Referring to FIG. 9, the battery system 200 includes the frequency detecting unit 201, gain reception unit 202, charge and discharge command value generator 203, charge and discharge adjustment unit 204, remaining power acquisition unit 901, and remaining power transmission unit 902.

The remaining power acquisition unit 901 acquires information about the remaining power of the battery, and then transfers the information to the charge and discharge command value generator 203 and the remaining power transmission unit 902.

The charge and discharge command value generator 203 generates the charge and discharge command value in accordance with the remaining power received from the remaining power acquisition unit 901, and then transmits the charge and discharge command value to the charge and discharge adjustment unit 204 (step S403 of FIG. 4).

The remaining power transmission unit 902 transmits the remaining power received from the remaining power acquisition unit 901 to the frequency control apparatus 300 via the communication network 104.

Figure 10:
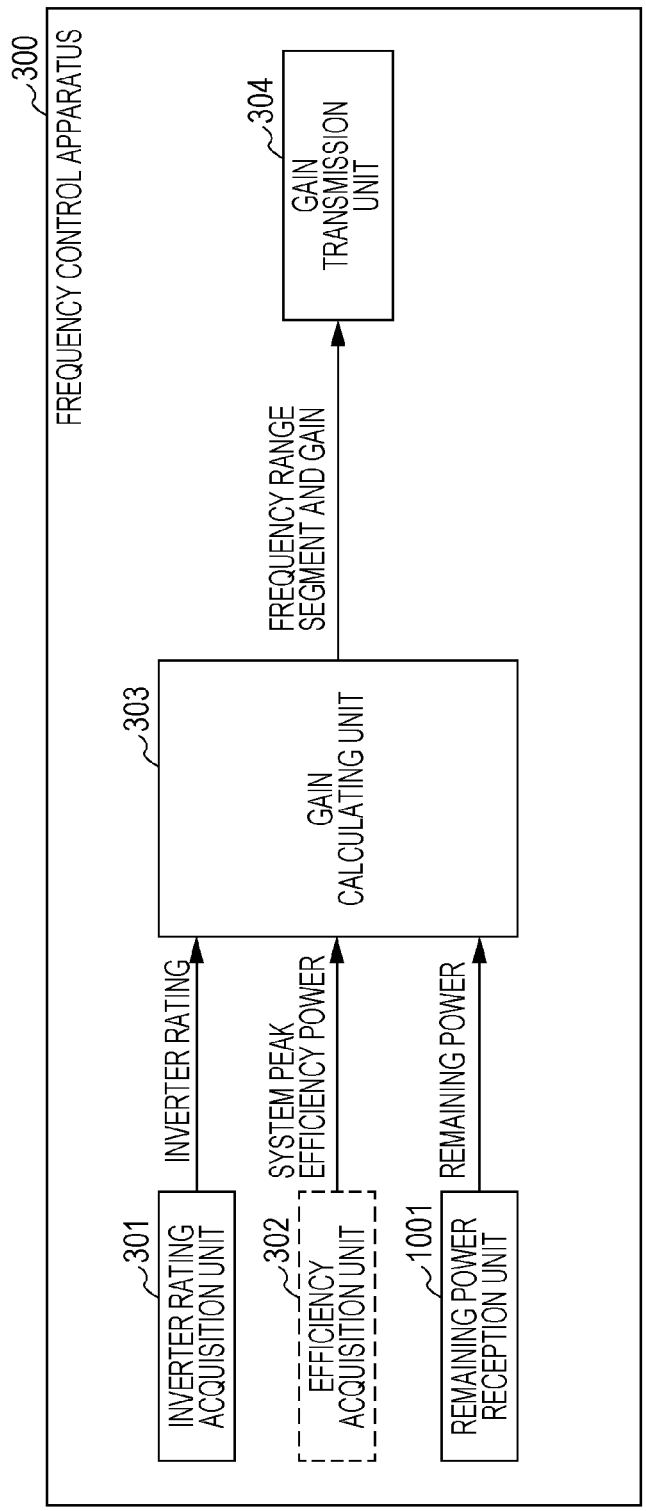
FIG. 10 is a functional block diagram illustrating another configuration of the frequency control apparatus of the first embodiment.

FIG. 10 is a functional block diagram illustrating another configuration of the frequency control apparatus 300 of the first embodiment. Elements identical to those described with reference to FIG. 3 are designated with the same reference numerals and the detailed discussion thereof is omitted herein.

Referring to FIG. 10, the frequency control apparatus 300 includes the inverter rating acquisition unit 301, efficiency acquisition unit 302, gain calculating unit 303, gain transmission unit 304, and remaining power reception unit 1001.

The remaining power reception unit 1001 acquires information about remaining power from the battery system 200 and then transfers the information to the gain calculating unit 303.

The gain calculating unit 303 determines the sequence of the battery systems in accordance with the remaining power received from the remaining power reception unit 1001 (step S505 of FIG. 5). The gain calculating unit 303 also calculates the gain of the battery system 200 using the remaining power received from the remaining power reception unit 1001 (step S506 of FIG. 5). The gain calculating unit 303 switches the gain setting in accordance with the remaining power. For example, if the remaining power of the first battery system 200 and the remaining power of the second battery system 200 fall within a range from 45 to 55 percent, gains are set. If either the remaining power of the first battery system 200 or the remaining power of the second battery system 200 fall outside of the range from 45 to 55 percent, the gain of the first battery system 200 and the gain of the second battery system 200 are respectively set to be 1. In this way, control is performed in view of the remaining power.

FIG. 11A through FIG. 11G illustrate a determination method of the gain in accordance with the first embodiment. In this example, the two battery systems 200 are used with the same inverter rating (100 kW). Also note that the inverter rating is used to calculate the gain.

Figure 11A:
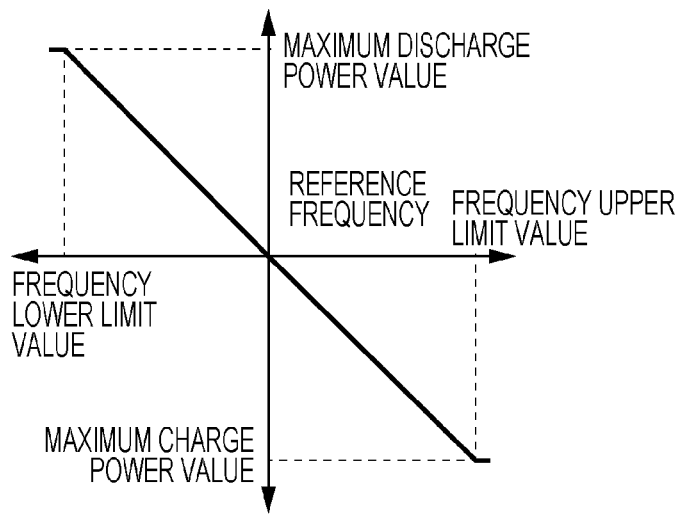
FIG. 11A through FIG. 11G illustrate a determination method of gain in accordance with the first embodiment.

FIG. 11A graphically illustrates formula (1). The abscissa represents measured frequency while the ordinate represents the charge and discharge command value with respect to the frequency. The charge and discharge command value at the upper limit frequency value is a maximum charge value, and the charge and discharge command value at the lower limit frequency value is a maximum discharge value. The charge and discharge command value is zero at the reference frequency. FIG. 11A and formula (1) are described for exemplary purposes only, and the disclosure is not limited thereto.

Figure 11B:
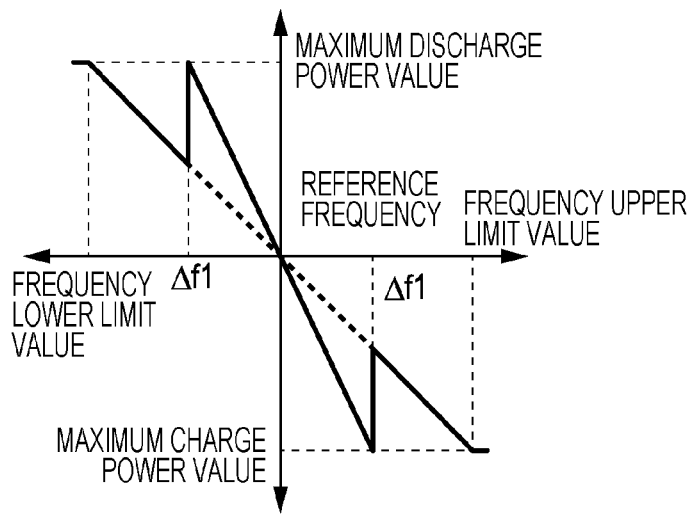
Figure 11C:
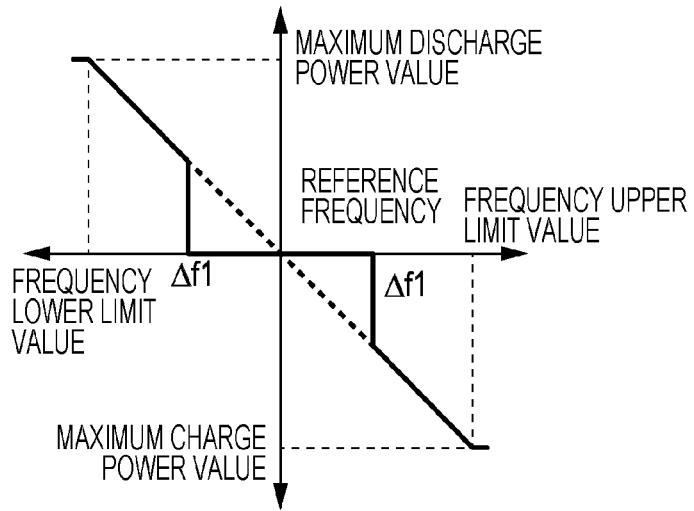

FIG. 11B and FIG. 11C illustrate the correction methods when the remaining power of the first battery system 200 and the remaining power of the second battery system 200 fall within a range from 45 to 55 percent. The abscissa represents measured frequency while the ordinate represents the charge and discharge command value with respect to the frequency.

Figure 11D:
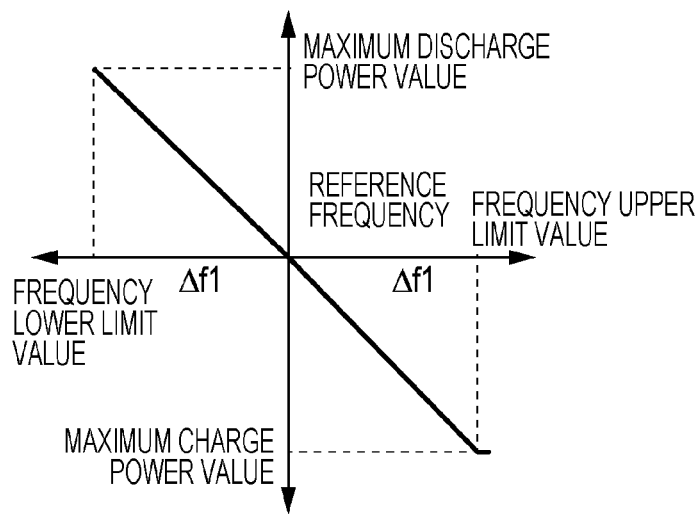
Figure 11E:
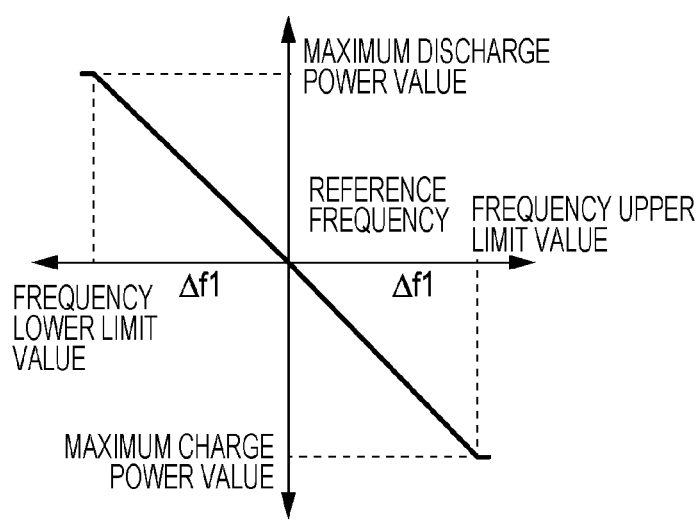
Figure 11F:
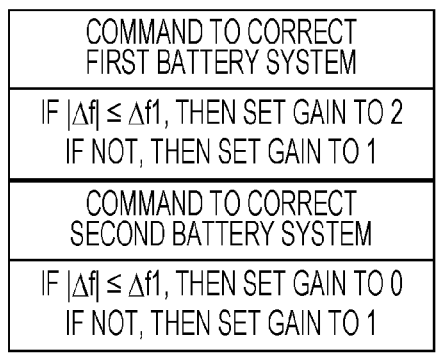
Figure 11G:
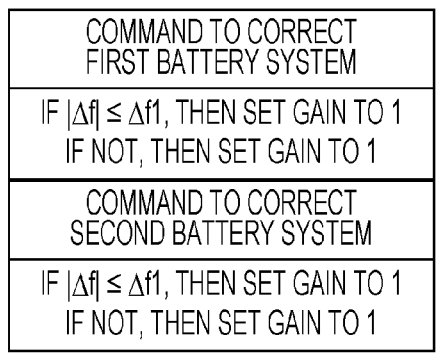

FIG. 11D and FIG. 11E illustrate the correction methods when either the remaining power of the first battery system 200 or the remaining power of the second battery system 200 falls outside of the range from 45 to 55 percent. The abscissa represents measured frequency while the ordinate represents the charge and discharge command value with respect to the frequency. Each of the first battery system 200 and the second battery system 200 has a gain of 1 and has the charge and discharge command value equal to those prior to correction (illustrated in FIG. 11A).

Control is thus performed in response to the remaining power. For example, in the calculation of the charge and discharge command value, formula (1) may be used if the remaining power falls within the range from 45 to 55 percent. If the remaining power falls outside of the range from 45 to 55 percent, formula (7) which is a version of formula (1) taking the remaining power into account may be used. Formula (7) is an example only, and the disclosure is not limited thereto.

$$\text{Charge and discharge command value} = \{(-1) \times (\text{frequency deviation}) \div (\text{permissible frequency deviation}) + ((\text{remaining power}) - 50\%) \div 1000\} \times (\text{inverter capacity})$$  (7)

where if the charge and discharge command value exceeds the inverter rating, the inverter rating may be used.

Second Embodiment

In a second embodiment, control to set a frequency of a power system closer to the reference frequency using a battery system is performed using a frequency control apparatus included in the battery system. Elements identical to those described with reference to the first embodiment are designated with the same reference numerals and the detailed discussion thereof is omitted herein.

Figure 12:
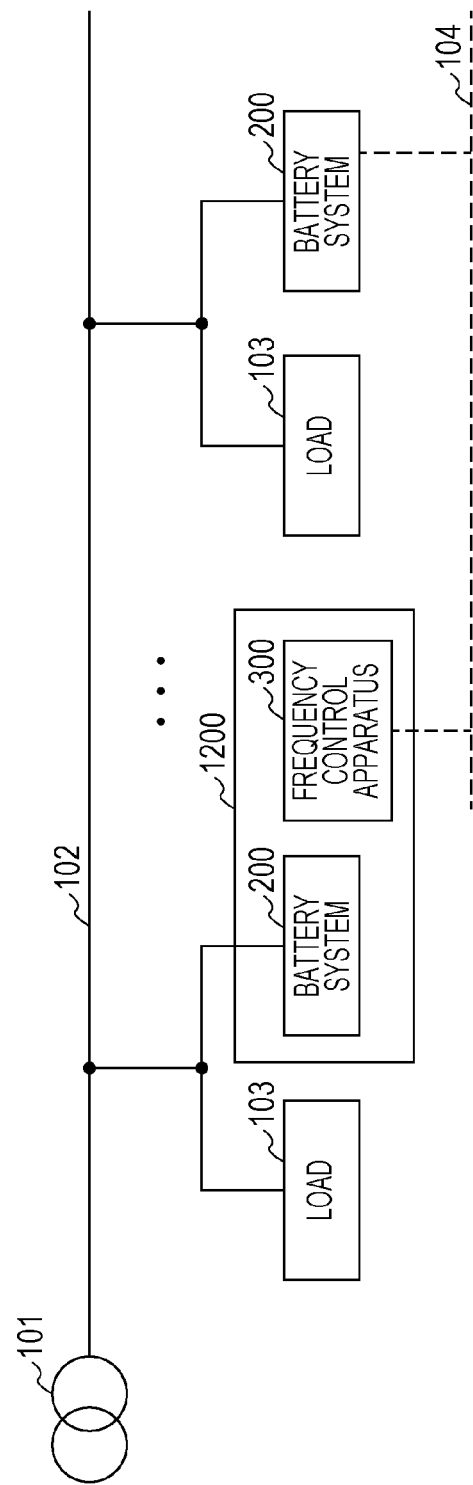
FIG. 12 is a block diagram illustrating the configuration of a power system including a frequency control apparatus of a second embodiment.

FIG. 12 is a block diagram illustrating the configuration of the power system including the frequency control apparatus of the second embodiment.

As illustrated in FIG. 12, the power system includes the distribution transformer 101, distribution line 102, load 103, communication network 104, battery system 200, and battery (storage battery) system 1200.

The battery system 1200 includes the battery system 200 and the frequency control (frequency regulation) apparatus 300.

The battery system 1200 pre-calculates the frequency range segment and gain allotment in accordance with the inverter rating of the battery system 200, and a power value maximizing the inverter efficiency, and then transmits the frequency range segment and gain to the battery system 200.

The battery system 200 and the battery system 1200 detect the frequency of the power supplied from the power system, and calculate the charge and discharge command value that sets the frequency of the power of the power system to be closer to the reference frequency. The battery system 200 corrects the charge and discharge command value by multiplying the charge and discharge command value by the gain allotment received from the battery system 1200. The battery system 200 performs the charge and discharge operation in response to the corrected charge and discharge command value. The battery system 1200 corrects the charge and discharge command value by multiplying the charge and discharge command value by the gain allotment received from the frequency control apparatus 300 included in the battery system 1200. The battery system 1200 performs the charge and discharge operation in response to the corrected charge and discharge command value.

The frequency control method of the second embodiment controls multiple battery systems even if the frequency control apparatus is included in the battery system.

Modifications

A system including a frequency control apparatus as a modification is described below. The embodiments described above perform local control frequency regulation. In the local control frequency regulation, each battery system detects the frequency, and calculates the charge and discharge command value responsive to the detected frequency to perform the charge and discharge operation. In the modification, centralized control frequency regulation is performed. The frequency control apparatus detects the frequency, calculates the charge and discharge command value responsive to the detected frequency, and notifies each battery system of the charge and discharge command value.

The whole system including the frequency control apparatus of the modification is similar to the system illustrated in FIG. 1 or FIG. 12. The system of the modification is different from the system of FIG. 1 or FIG. 12 in that a battery system 200a is employed in place of the battery system 200 and that a frequency control apparatus 300a is employed in place of the frequency control apparatus 300. The following discussion focuses on the difference.

Figure 13:
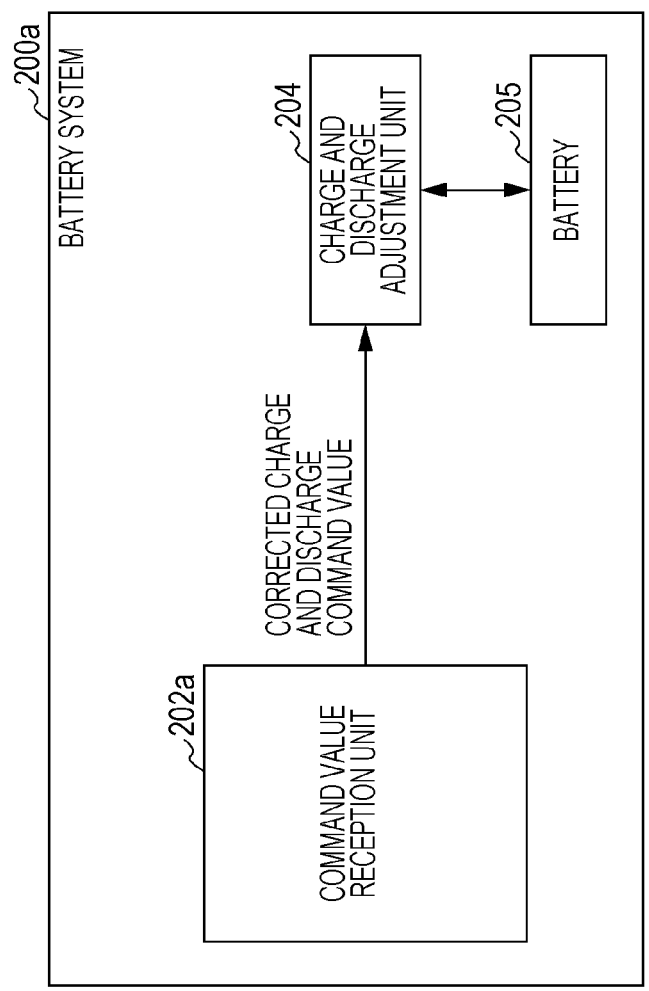
FIG. 13 is a functional block diagram illustrating the configuration of a battery system of a modification.

FIG. 13 is a functional block diagram illustrating the configuration of the battery system 200a of the modification. The battery system 200a is different from the battery system 200 of FIG. 2 in that the battery system 200a includes a command value reception unit 202a, in place of the frequency detecting unit 201, the gain reception unit 202, and the charge and discharge command value generator 203.

The command value reception unit 202*a* receives the corrected charge and discharge command value responsive to the current frequency from the frequency control apparatus 300*a*, and outputs the received corrected charge and discharge command value to the charge and discharge adjustment unit 204.

Rather than detecting the frequency, calculating and correcting the charge and discharge command value responsive to the detected frequency, and performing the charge and discharge operation, the battery system 200*a* receives the corrected charge and discharge command value from the frequency control apparatus 300*a* on a real-time basis, and performs the charge and discharge operation in accordance with the corrected charge and discharge command value.

The configuration of the battery system 200*a* is thus simple compared with the system of FIG. 1 or FIG. 12.

Figure 14:
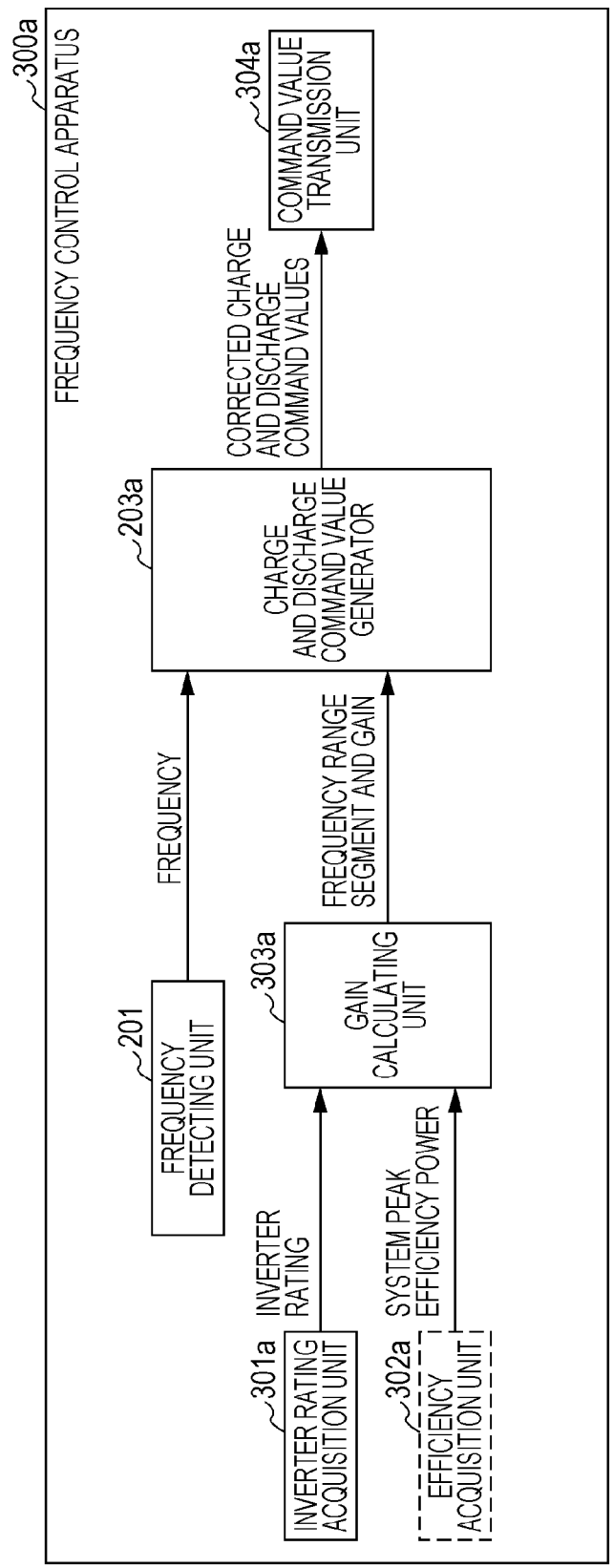
FIG. 14 is a functional block diagram illustrating the configuration of a frequency control apparatus of the modification.

FIG. 14 is a functional block diagram illustrating the configuration of the frequency control apparatus 300*a* of the modification. The frequency control apparatus 300*a* is different from the frequency control apparatus 300 illustrated in FIG. 3 in that the frequency control apparatus 300*a* includes an inverter rating acquisition unit 301*a*, an efficiency acquisition unit 302*a*, a gain calculating unit 303*a*, and a gain transmission unit 304*a* in place of the inverter rating acquisition unit 301, the efficiency acquisition unit 302, the gain calculating unit 303, and the gain transmission unit 304. The frequency control apparatus 300*a* also different from the frequency control apparatus 300 in that the frequency control apparatus 300*a* further includes the frequency detecting unit 201 and charge and discharge command value generator 203*a*. The following discussion focuses the difference.

The inverter rating acquisition unit 301*a*, the efficiency acquisition unit 302*a*, and the gain calculating unit 303*a* are respectively similar in function to the inverter rating acquisition unit 301, the efficiency acquisition unit 302, and the gain calculating unit 303.

The inverter rating acquisition unit 301*a* acquires the inverter rating from each of multiple battery systems 200*a*.

The efficiency acquisition unit 302*a* acquires the inverter efficiency from each of the multiple battery systems 200*a*.

The gain calculating unit 303*a* generates for each of the multiple battery apparatuses a correction instruction including a gain for each of the multiple frequency range segments.

The charge and discharge command value generator 203*a* stores discharge characteristic data and charge characteristic data for each of the multiple battery systems 200*a*, and calculates the charge and discharge command value responsive to the frequency detected by the frequency detecting unit 201. The charge and discharge command value generator 203*a* corrects the charge and discharge command value responsive to the current frequency detected by the frequency detecting unit 201 for each of the multiple battery systems 200*a* in response to the correction instruction.

The command value transmission unit 304*a* transmits to each of the multiple battery systems 200*a* the corrected charge and discharge command value corrected for each of the multiple battery systems 200*a*. The corrected charge and discharge command value may be transmitted periodically (every several 100 ms to every several seconds) or depending on a fluctuation of the frequency.

The frequency control apparatus 300*a* and the battery system 200*a* in the modification perform the centralized control frequency regulation. The centralized control frequency regulation is performed in a configuration simpler than the local control frequency regulation.

Each element in the embodiments may be implemented using a dedicated hardware resource or by executing a software program suitable for each element. Each element may be implemented by a program executing device, such as a central processing unit (CPU) or a processor, when the program executing device reads the software program from a hard disk or a semiconductor memory and executes the software program. The software program to implement the frequency control apparatus of the embodiments is described below.

The software program causes a computer to implement the frequency control method.

The frequency control apparatuses of one or more embodiments have been described. The disclosure is not limited to the embodiments. Modifications and changes are possible to the embodiments without departing from the scope of the disclosure. An embodiment as a result of combining elements in the embodiments also falls in the scope of one or more embodiments described above.

The operational example of the frequency control apparatus of FIG. 5 may be performed not only immediately subsequent to the start of the operation, but also periodically (once every tens of minutes to once every several hours). In this way, the overall efficiency may be increased in response to a change in the state of the battery system 200, such as a change in the remaining power of the battery system 200.

In the first embodiment, the battery system 200 stores the characteristic data of the charge and discharge command value illustrated in FIG. 6A, receives the gain as a correction coefficient, and then corrects the charge and discharge command value. In contrast, the battery system 200 may receive and store the data representing the charge and discharge command value of FIG. 6B and FIG. 6C from the frequency control apparatus 300.

The technique of the disclosure finds applications in a frequency control apparatus that performs control to set a frequency of a power system to a reference frequency. More specifically, the technique finds applications in a frequency control apparatus that controls the frequency of a power system operated and managed by an electric power company.

What is claimed is:

1. A frequency control method comprising:
   segmenting a range from a predetermined reference frequency to a predetermined lower limit frequency or a predetermined upper limit frequency into frequency range segments according to a number of battery apparatuses;
   detecting a current frequency of a power system; and
   causing battery apparatuses to charge from the power system or discharge to the power system in order to control a frequency or maintain a supply and demand balance of the power system,
   wherein the method causes lager number of battery apparatuses to charge or discharge as a frequency range segment including the current frequency becomes farther apart from the reference frequency.

2. The frequency control method according to claim 1, wherein the frequency range segments include a first frequency range segment and a second frequency range segment, an absolute value of a difference between a frequency in the first frequency range segment and the reference frequency is equal to zero or higher to a frequency lower than a first value, and an absolute value of a difference between a frequency in the second frequency range segment and the reference frequency is equal to the first value or larger and lower than a second value, assigning first battery apparatuses that discharge or charge in all the frequency range segments, and second battery apparatuses that discharge or charge in the frequency range segments other than the first frequency range segment, according to at least one of a degree of degradation of, a remaining power quantity of, and a frequency of use of the battery apparatuses, and causing the first battery apparatuses to discharge to the power system and causing the second battery apparatuses not to discharge to the power system, or causing the first battery apparatuses to charge from the power system and causing the second battery apparatuses not to charge from the power system, when the current frequency of the power system is within the first frequency range segment.

3. The frequency control method according to claim 2, wherein as a frequency deviation between the current frequency and the reference frequency becomes larger in each of the frequency range segments, causing the first battery apparatuses to discharge power more to the power system, or charge power more from the power system, and wherein in the first battery apparatuses, a rate of increase in the discharge power or the charge power with respect to the frequency deviation in the first frequency range segment is set higher than a rate of increase in the discharge power or the charge power with respect to the frequency deviation in any other frequency range segment.

4. The frequency control method according to claim 3, wherein in the first frequency range segment, the discharge power from the first battery apparatuses to the power system increases from zero to first discharge power in accordance with the frequency deviation, and the charge power from the power system to the first battery apparatus increases from zero to first charge power in accordance with the frequency deviation, and wherein in the second frequency range segment, the discharge power from the first battery apparatuses to the power system increase from second discharge power lower than the first discharge power to third discharge power in accordance with the frequency deviation, and the charge power from the power system to the first battery apparatuses increase from second charge power lower than the first charge power to third charge power in accordance with the frequency deviation.

5. The frequency control method according to claim 3, wherein each of the battery apparatuses comprises:

a battery; and an inverter that discharges to the power system by converting direct-current power from the battery into alternating-current power, or charges the battery by converting alternating-current power from the power system into direct-current power, wherein as a capacity of the inverter in the first battery apparatus is smaller, a rate of increase in the discharge power or the charge power of the first battery apparatus in the first frequency range segment caused to be higher.

6. The frequency control method according to claim 3, in the second frequency range segment, a rate of increase in the discharge power from the first battery apparatus to the power system is caused to match a rate of increase in the discharge power from the second battery apparatus to the power system, and a rate of increase in the charge power from the power system to the first battery apparatus is caused to match a rate of increase in charge power from the power system to the second battery power.

7. The frequency control method according to claim 4, wherein each value of the first discharge power and the first charge power is a maximum rated value of the first battery apparatus.

8. The frequency control method according to claim 4, wherein each of the battery apparatuses comprises:

a battery; and an inverter that discharges to the power system by converting direct-current power from the battery into alternating-current power, or charges the battery by converting alternating-current power from the power system into direct-current power, wherein each value of the first charge power and the first discharge power is power that maximizes a conversion efficiency of the inverter in the first battery apparatus, or a charge and discharge efficiency of the battery, or a product of the conversion efficiency and the charge and discharge efficiency.

9. The frequency control method according to claim 7, wherein the second discharge power is discharge power at a frequency resulting from subtracting the first value from the reference frequency in discharge characteristic data where the discharge power increases from zero at the reference frequency at a predetermined rate of increase to maximum discharge power of the first battery apparatus at the lower limit frequency, and wherein the second charge power is charge power at a frequency resulting from adding the first value to the reference frequency in charge characteristic data where the charge power increases from zero at the reference frequency at a predetermined rate of increase to maximum charge power of the first battery apparatus at the upper limit frequency.

10. The frequency control method according to claim 9, further comprising:

generating a correction command for each of the battery apparatuses in the frequency control apparatus, the correction command including a correction coefficient for each of the frequency range segments;

transmitting to the battery apparatuses the correction commands respectively corresponding to the battery apparatuses from the frequency control apparatus;

correcting a charge and discharge command value according to the frequency detected in the detecting in response to the correction command in each of the battery apparatuses; and discharging to the power system or charging each of the battery apparatuses from the power system in response to the corrected charge and discharge command value, wherein the charge and discharge value respectively represents charge power or discharge power uniquely set for the frequency in the charge characteristic data or the discharge characteristic data.

11. The frequency control method according to claim 9, further comprising:

generating a correction command for each of the battery apparatuses in the frequency control apparatus, the correction command including a correction coefficient for each of the frequency range segments;

correcting a charge and discharge command value according to the frequency detected in the detecting on each of the battery apparatuses in response to the correction command;

transmitting to the battery apparatuses the corrected charge and discharge command values respectively corresponding to the battery apparatuses from the frequency control apparatus; and discharging from each of the battery apparatuses or charging each of the battery apparatuses in response to the corrected charge and discharge command value transmitted from the frequency control apparatus, wherein the charge and discharge value respectively represents charge power or discharge power uniquely set for the frequency in the charge characteristic data or the discharge characteristic data.

12. A frequency control device comprising:

one or more memories; and circuitry operative to:

segment a range from a predetermined reference frequency to a predetermined lower limit frequency or a predetermined upper limit frequency into frequency range segments according to a number of battery apparatuses;

detect a current frequency of a power system; and cause battery apparatuses to charge from the power system or discharge to the power system in order to control a frequency or maintain a supply and demand balance of the power system, wherein the device causes lager number of battery apparatuses to charge or discharge as a frequency range segment including the current frequency becomes farther apart from the reference frequency.

* * * * *